(12) United States Patent
Shirai et al.

(10) Patent No.: US 8,400,048 B2
(45) Date of Patent: Mar. 19, 2013

(54) TUNING-FORK TYPE PIEZOELECTRIC RESONATOR PLATE COMPRISING LEG PORTIONS AND A BONDING PORTION RESPECTIVELY PROVIDED ON FIRST AND SECOND END FACES OF A BASE PORTION

(75) Inventors: Takashi Shirai, Kakogawa (JP); Yoshinobu Sakamoto, Kakogawa (JP); Syunsuke Satoh, Kakogawa (JP); Tomo Fujii, Kakogawa (JP); Masato Itoh, Kakogawa (JP); Yoshinari Morimoto, Kakogawa (JP)

(73) Assignee: Daishinku Corporation, Kakogawa-Shi ( * ) Notice: Subject to any disclaimer, the term of this patent is extended or adjusted under 35 U.S.C. 154(b) by 436 days.

(21) Appl. No.: 12/740,556

(22) PCT Filed: Sep. 18, 2009

(86) PCT No.: PCT/JP2009/066389
§ 371 (c)(1),
(2), (4) Date: Apr. 29, 2010

(87) PCT Pub. No.: WO2010/035714
PCT Pub. Date: Apr. 1, 2010

(65) Prior Publication Data
US 2011/0043079 A1    Feb. 24, 2011

(30) Foreign Application Priority Data
Sep. 26, 2008   (JP) ................................ 2008-248218

(51) Int. Cl.
*H03H 9/19*   (2006.01)
(52) U.S. Cl. .................. 310/370; 73/504.02; 73/504.16
(58) Field of Classification Search .................. 310/370; 331/315, 158; 73/504.02, 504.16
See application file for complete search history.

(56) References Cited

U.S. PATENT DOCUMENTS

| | | | | |
|---|---|---|---|---|
| 6,806,797 | B2 * | 10/2004 | Kikushima | 333/200 |
| 7,061,167 | B2 * | 6/2006 | Yamada | 310/370 |
| 7,592,741 | B2 * | 9/2009 | Tanaya et al. | 310/370 |
| 7,714,484 | B2 * | 5/2010 | Hara et al. | 310/348 |
| 7,863,803 | B2 * | 1/2011 | Yamada et al. | 310/370 |
| 7,902,731 | B2 * | 3/2011 | Ishihara et al. | 310/370 |
| 8,093,787 | B2 * | 1/2012 | Ichikawa | 310/370 |
| 8,134,284 | B2 * | 3/2012 | Kawanishi | 310/370 |

(Continued)

FOREIGN PATENT DOCUMENTS

| | | |
|---|---|---|
| JP | 57-054418 A | 3/1982 |
| JP | 61-187411 A | 8/1986 |

(Continued)

*Primary Examiner* — Jaydi San Martin
(74) *Attorney, Agent, or Firm* — Marvin A. Motsenbocker; Mots Law, PLLC

(57) ABSTRACT

A tuning-fork type piezoelectric resonator plate includes: at least a plurality of leg portions serving as vibrating portions; a bonding portion bonded to the outside, and a base portion from which the leg portions and the bonding portion protrude. The plurality of leg portions protrude from a first end face of the base portion and are provided side-by-side on the first end face. The bonding portion protrude from a second end face located opposite the first end face of the base portion at a position located opposite a center position of the plurality of leg portions in a width direction of the first end face of the base portion. And, at least a base end portion of the bonding portion is used as a bond region that is bonded to the outside.

16 Claims, 21 Drawing Sheets

U.S. PATENT DOCUMENTS

| | | | |
|---|---|---|---|
| 8,148,875 B2 * | 4/2012 | Aratake | 310/312 |
| 8,156,621 B2 * | 4/2012 | Iwai | 29/25.35 |
| 8,174,171 B2 * | 5/2012 | Iwai | 310/370 |
| 8,203,256 B2 * | 6/2012 | Saito | 310/370 |
| 2009/0289531 A1 * | 11/2009 | Fang et al. | 310/370 |
| 2011/0193647 A1 * | 8/2011 | Minegishi | 331/158 |
| 2011/0316391 A1 * | 12/2011 | Matsudo et al. | 310/344 |
| 2012/0137775 A1 * | 6/2012 | Yamada | 73/504.16 |
| 2012/0195170 A1 * | 8/2012 | Kobayashi | 368/47 |
| 2012/0216614 A1 * | 8/2012 | Matsumoto et al. | 73/504.16 |

FOREIGN PATENT DOCUMENTS

| | | |
|---|---|---|
| JP | 2004-343541 A | 12/2004 |
| JP | 2004-357178 A | 12/2004 |
| JP | 2004-357178 A5 | 12/2004 |
| JP | 2008-022413 A | 1/2008 |
| WO | WO 2007/017992 A1 | 2/2007 |

* cited by examiner

TUNING-FORK TYPE PIEZOELECTRIC RESONATOR PLATE COMPRISING LEG PORTIONS AND A BONDING PORTION RESPECTIVELY PROVIDED ON FIRST AND SECOND END FACES OF A BASE PORTION

TECHNICAL FIELD

The present invention relates to a tuning-fork type piezoelectric resonator plate and a tuning-fork type piezoelectric resonator device.

BACKGROUND ART

As one of piezoelectric resonator devices, a tuning-fork type crystal resonator is known that employs a tuning-fork type crystal resonator plate including a base portion and a vibrating portion that has two leg portions protruding from the base portion (see, for example, Patent Document 1).

In such a tuning-fork type crystal resonator plate, a bonding portion that is bonded to the outside is formed protruding from an end face opposite the other end face of the base portion in which the two leg portions are formed. The bonding portion formed protruding from the end face of the base portion is shaped to extend therefrom and branch into two directions toward both sides, forming a T shape, and the distal end portions of the bonding portion extend in the same direction as the distal end portions of the two leg portions.

The main body casing of the tuning-fork type crystal resonator is made up of a base and a lid. Inside the main body casing, the distal end portions of the bonding portion of the tuning-fork type crystal resonator plate are electromechanically bonded to the base with a conductive material, and the bonded tuning-fork type crystal resonator plate is hermetically sealed inside the main body casing. With the tuning-fork type crystal resonator, vibration leak (acoustic leak) can be prevented.

PRIOR ART DOCUMENT

Patent Document

Patent Document 1: JP 2004-357178A

SUMMARY OF INVENTION

Problem to be Solved by the Invention

As described above, with the tuning-fork type piezoelectric vibrator of Patent Document 1, because the distal end portions of the bonding portion of the tuning-fork type crystal resonator plate are electromechanically bonded to the base with a conductive material, routing electrodes that extend from the leg portions, serving as vibrating portions, to the bonding positions of the base become long, and therefore the vibrations generated in the leg portions are not easily transmitted.

In addition, because the substantial distance between the distal end portion of the bonding portion that is bonded to the base and the leg portions serving as vibrating portions through the base portion is long, the crystal resonator plate is susceptible to stress from vibrations and external force applied when an impact is applied to the tuning-fork type crystal resonator from the outside, and might easily be cracked upon receiving such stress or external force in the base portion or bonding portion. Furthermore, because the overall length of the bonding portion as viewed from above is long, the base is required to secure a mount region on which the bonding portion having such a long overall length as viewed from above is mounted, which hinders the miniaturization of the main body casing of the crystal resonator.

In order to solve the above problems, it is an object of the present invention to provide a tuning-fork type piezoelectric resonator plate and a tuning-fork type piezoelectric resonator device that prevent acoustic leak, have resistance to stress and external forces, and are suitable for miniaturization.

Means for Solving the Problems

In order to achieve the above object, a tuning-fork type piezoelectric resonator plate according to the present invention is a tuning-fork type piezoelectric resonator plate including: at least a plurality of leg portions serving as vibrating portions; a bonding portion bonded to the outside, and a base portion from which the leg portions and the bonding portion protrude, wherein the plurality of leg portions protrude from a first end face of the base portion and are provided side-by-side on the first end face, the bonding portion protrude from a second end face located opposite the first end face of the base portion at a position located opposite a center position of the plurality of leg portions in a width direction of the first end face of the base portion, and at least a base end portion of the bonding portion is used as a bond region that is bonded to the outside.

According to the present invention, it is possible to provide a tuning-fork type piezoelectric resonator plate that prevents acoustic leak, has resistance to stress and external forces, is capable of preventing the occurrence of defects such as cracks in the tuning-fork type piezoelectric resonator plate, and is suitable for miniaturization.

Specifically, the tuning-fork type piezoelectric resonator plate of the present invention includes at least a plurality of leg portions, a bonding portion and a base portion, wherein the plurality of leg portions protrude from a first end face of the base portion and are provided side-by-side on the first end face, the bonding portion protrude from a second end face located opposite the first end face of the base portion at a position located opposite a center position of the plurality of leg portions in a width direction of the first end face of the base portion, and at least a base end portion of the bonding portion is used as a bond region bonded to the outside. Because the base end portion of the bonding portion that is located in the vicinity of the base portion is used as a bond region bonded to the outside, it is possible to obtain a configuration that is resistant to stress and external forces. Furthermore, because the bonding portion protrude from the position opposite the center position of the plurality of leg portions in the width direction of the first end face of the base portion, it is possible to prevent acoustic leak. A situation can occur such as, for example, an oscillation frequency deviation occurs due to bonding the tuning-fork type piezoelectric resonator plate to other members such as mounting it onto the outside, or due to the application of external forces onto the tuning-fork type piezoelectric resonator plate. However, according to the present invention, such a situation will not occur.

In addition, according to the present invention, it is possible to not only reduce harmful effects of acoustic leak, but also to widen the bonding portion. In this case, even if an external force (e.g., an external force applied to the tuning-fork type piezoelectric resonator plate by the tuning-fork type piezoelectric resonator plate being dropped) is applied to the tuning-fork type piezoelectric resonator plate, it is possible to suppress the occurrence of physical and electrical breaks in the bonding portion. As a result, according to the present invention, it is possible to improve the durability such as, for example, impact resistance.

In the above-described configuration, it is possible that a pair of driving electrodes are formed in the leg portions, and lead electrodes drawn out from the pair of driving electrodes are formed in the bonding portion and the base portion, respectively, the lead electrode drawn out from one of the pair of driving electrodes is formed in the base end portion of the bonding portion, and the lead electrode drawn out from the other of the pair of driving electrodes is formed in a distal end portion of the bonding portion, and the distal end portion of the bonding portion is used as a bond region bonded to the outside.

In this case, particularly because the base end portion and the distal end portion of the bonding portion are used as bond regions, one of the driving electrodes is formed in the base end portion of the bonding portion, and the other driving electrode is formed in the distal end portion of the bonding portion, it is possible to prevent short-circuiting in the bond regions bonded to the outside. Furthermore, by defining such a bond region in the base end portion and the distal end portion of the bonding portion, it is possible to obtain a configuration that prevents acoustic leak and has resistance to stress and external forces.

In the above-described configuration, the bonding portion may be formed into an L shape as viewed from above. For example, the bonding portion may be formed into an L shape as viewed from above that is made up of a short-side portion that protrudes perpendicularly to the second end face as viewed from above and a long-side portion that is connected to and bent with respect to the extremity of the short-side portion at the right angle as viewed from above and extends in the width direction of the base portion.

In this case, because the bonding portion is formed into an L shape as viewed from above, the overall length and width as viewed from above of the tuning-fork type piezoelectric resonator plate can be reduced, contributing to miniaturization of the main body casing of the tuning-fork type piezoelectric resonator plate. Furthermore, in the case where a plurality of tuning-fork type piezoelectric resonator plates are formed from a single wafer, the number of tuning-fork type piezoelectric resonator plates produced from a single wafer can be increased. It is also possible to suppress the deformation of the tuning-fork type piezoelectric resonator plate in the thickness direction when an external force such as an impact is applied from the outside, so that when the tuning-fork type piezoelectric resonator plate is mounted onto an external member (a piezoelectric resonator device made up of a first sealing member and a second sealing member described below), it is possible to prevent the tuning-fork type piezoelectric resonator plate from coming into contact with the external member. As a result, it is possible to prevent the vibrating portions from chipping or the like due to coming into contact with the external member, and the oscillation frequency from varying. In addition, leaking vibrations generated by the vibrations of the vibrating portions can be confined to a bent part (a corner portion described below) of the L-shaped bonding portion as viewed from above, making it difficult for the vibrations to be transmitted to the distal end portion of the bonding portion, and further reducing the acoustic leak.

In the above-described configuration, the bond region of the bonding portion that is bonded to the outside may be formed in a corner portion that is a bent part of the L-shaped bonding portion as viewed from above and in the distal end portion of the bonding portion.

In this case, because the bond region of the bonding portion bonded to the outside is formed in the corner portion and the distal end portion, leaking vibrations generated by the vibrations of the vibrating portions can be confined to the corner portion, suppressing the transmission of the vibrations to the distal end portion, as a result of which the acoustic leak can be further reduced.

In the above-described configuration, a side face of an inner corner of the corner portion may be formed into a curved face.

In this case, because the side face of the inner corner of the corner portion is formed into a curved face, with the side face of the inner corner, the occurrence of cracks originating from the corner portion can be suppressed, as a result of which it is possible to prevent short-circuiting of the lead electrode. In addition, in this case, the strength of the corner portion can be increased, as a result of which it is possible to suppress variations and shifts of the frequency.

In the above-described configuration, a side face of an inner corner of the corner portion may be formed into a polygonally bent face.

In this case, because the side face of the inner corner of the corner portion is formed into a polygonally bent face, with the side face of the inner corner, the occurrence of cracks originating from the corner portion can be suppressed, as a result of which it is possible to prevent short-circuiting of the lead electrode. In addition, in this case, the strength of the corner portion can be increased, as a result of which it is possible to suppress variations and shifts of the frequency.

In the above-described configuration, both primary surfaces of the base end portion of the bonding portion may be used as bond regions bonded to the outside.

In this case, because both primary surfaces of the base end portion of the bonding portion are used as bond regions bonded to the outside, it is possible to prevent the overall length and width as viewed from above of the tuning-fork type piezoelectric resonator plate from increasing while reducing acoustic leak, contributing to miniaturization of the main body casing of the tuning-fork type piezoelectric resonator plate. As a result, in the case where a plurality of tuning-fork type piezoelectric resonator plates are formed from a single wafer, the number of tuning-fork type piezoelectric resonator plates produced from a single wafer can be increased.

In the above-described configuration, it is possible that a pair of driving electrodes are formed in the leg portions, and lead electrodes drawn out from the pair of driving electrodes are formed in the bonding portion and the base portion, respectively, the lead electrode drawn out from one of the pair of driving electrodes is formed in the base end portion of the bonding portion, and the lead electrode drawn out from the other of the pair of driving electrodes is formed in a distal end portion of the bonding portion, the base end portion and the distal end portion of the bonding portion are used as bond regions bonded to the outside, a bump bonded to the outside is formed in each of the bond regions, and the bump formed in the bond region of the base end portion of the bonding portion is smaller than the bump formed in the bond region of the distal end portion of the bonding portion.

In this case, because the bump formed in the bond region of the base end portion of the bonding portion is smaller than the bump formed in the bond region of the distal end portion of the bonding portion, it is possible to reduce the transmission of vibrations from the vibrating portions to the bond region of the base end portion of the bonding portion which is closer to the vibrating portions, while increasing the bonding strength of the piezoelectric resonator plate to the outside in the bond region of the distal end portion of the bonding portion 23 which is far from the vibrating portions. As a result, it is possible to increase the bonding strength of the piezoelectric resonator plate to the outside while suppressing the influence of vibrations from the vibrating portions.

In the above-described configuration, the base portion may have a right-and-left symmetrical shape as viewed from above, and a second end portion of the base portion may be formed such that the base portion tapers from the first end face side to the second end face side.

In this case, because the base portion has a right-and-left symmetrical shape as viewed from above, and the second end portion of the base portion is formed such that the base portion tapers from the first end face side to the second end face side, with the second end portion, it is possible to attenuate leaking vibrations generated by the vibrations of the vibrating portions and suppress the transmission of the leaking vibrations to the bonding portion, and therefore this configuration is preferable to further reduce acoustic leak (vibration leak).

In the above-described configuration, a plated bump may be formed in the bond regions.

In this case, because a plated bump is formed in the bond regions, it is possible to increase the positioning accuracy when forming the plated bumps in the tuning-fork type piezoelectric resonator plate, and even if the bonding portion of the tuning-fork type piezoelectric resonator plate is reduced in size, the plated bumps can be formed in appropriate positions of the tuning-fork type piezoelectric resonator plate as bonding members. In addition, the formation of the plated bumps can be performed simultaneously with the formation of other metal materials (e.g., driving electrodes, etc.) of the tuning-fork type piezoelectric resonator plate.

In the above-described configuration, a groove may be formed in a primary surface of at least one of the vibrating portions.

In this case, because a groove is formed in a primary surface of at least one of the vibrating portions, it is possible to improve the resonance resistance value, which would otherwise be deteriorated due to miniaturization of the tuning-fork type piezoelectric resonator plate.

In order to achieve the above object, a tuning-fork type piezoelectric resonator device according to the present invention includes the above-described tuning-fork type piezoelectric resonator plate of the present invention, a first sealing member on which the tuning-fork type piezoelectric resonator plate is mounted, and a second sealing member for hermetically sealing the tuning-fork type piezoelectric resonator plate mounted on the first sealing member within a main body casing.

According to the present invention, it is possible to provide a tuning-fork type piezoelectric resonator device that prevents acoustic leak, has resistance to stress and external forces, is capable of preventing the occurrence of defects such as cracks in the tuning-fork type piezoelectric resonator plate, and is suitable for miniaturization. Specifically, according to the present invention, because the tuning-fork type piezoelectric resonator device includes the above-described tuning-fork type piezoelectric resonator plate of the present invention, the same operational effects as those of the tuning-fork type piezoelectric resonator plate of the present invention are obtained.

In the above-described configuration, a step on which the tuning-fork type piezoelectric resonator plate is mounted may be provided in the first sealing member, and an edge of the step and the base end portion of the bonding portion may overlap as viewed from above.

In this case, because the edge of the step and the base end portion of the bonding portion overlap as viewed from above, even if an external force (e.g., an external force applied to the tuning-fork type piezoelectric resonator device by the tuning-fork type piezoelectric resonator device being dropped) is applied to the tuning-fork type piezoelectric resonator device, it is possible to suppress the tuning-fork type piezoelectric resonator plate (in particular, the vibrating portions and the base portion) from coming into contact with the first sealing member. Accordingly, even if an external force is applied to the tuning-fork type piezoelectric resonator plate, variations and shifts of the frequency can be suppressed, and the durability such as impact resistance can be improved.

Effects of the Invention

With the tuning-fork type piezoelectric resonator plate and tuning-fork type piezoelectric resonator device of the present invention, it is possible to prevent acoustic leak, and attain resistance to stress and external forces, and prevent the occurrence of defects such as cracks in the tuning-fork type piezoelectric resonator plate.

Description of Reference Numerals

| | |
|---|---|
| 1 | Tuning-Fork Type Crystal Resonator (Tuning-Fork Type Piezoelectric Resonator Device) |
| 2 | Tuning-Fork Type Crystal Resonator plate (Tuning-Fork Type Piezoelectric Resonator Plate) |
| 21 | First Leg Portion (Leg Portion) |
| 211 | Distal End Portion of First Leg Portion (Distal End Portion of the Leg) |
| 22 | Second Leg Portion (Leg Portion) |
| 221 | Distal End Portion of Second Leg Portion (Distal End Portion of the Leg) |
| 23 | Bonding Portion |
| 231 | Short-Side Portion |
| 232 | Long-Side Portion |
| 233 | Distal End Portion |
| 234 | Corner Portion |
| 235 | Side Face |
| 236 | Frame Body |
| 24 | Plated Bump |
| 25 | Base Portion |
| 251 | First End Face |
| 252 | Second End Face |
| 254 | Second End Portion |
| 26 | Primary Surface |
| 27 | Groove |
| 28 | Side Face |
| 291 | First Driving Electrode |
| 292 | Second Driving Electrode |
| 293, 294 | Lead Electrode |
| 295 | Metal Film |
| 3 | Base (First Sealing Member) |
| 31 | Bottom Portion |
| 32 | Dike Portion |
| 33 | Metallization Layer |
| 34 | Electrode Pad |
| 4 | Lid |
| 41 | Top Portion |
| 42 | Wall Portion |

MODE FOR CARRYING OUT THE INVENTION

Hereinafter, embodiments of the present invention will be described with reference to the drawings. It should be noted that the embodiments given below describe the case in which the present invention is applied to a tuning-fork type crystal resonator serving as a tuning-fork type piezoelectric resonator device. However, the embodiments are merely preferable examples, and therefore the present invention is not limited to the tuning-fork type crystal resonator, and can be used in any tuning-fork type piezoelectric resonator device that incorporates a tuning-fork type piezoelectric resonator plate made of a piezoelectric material.

Figure 1:
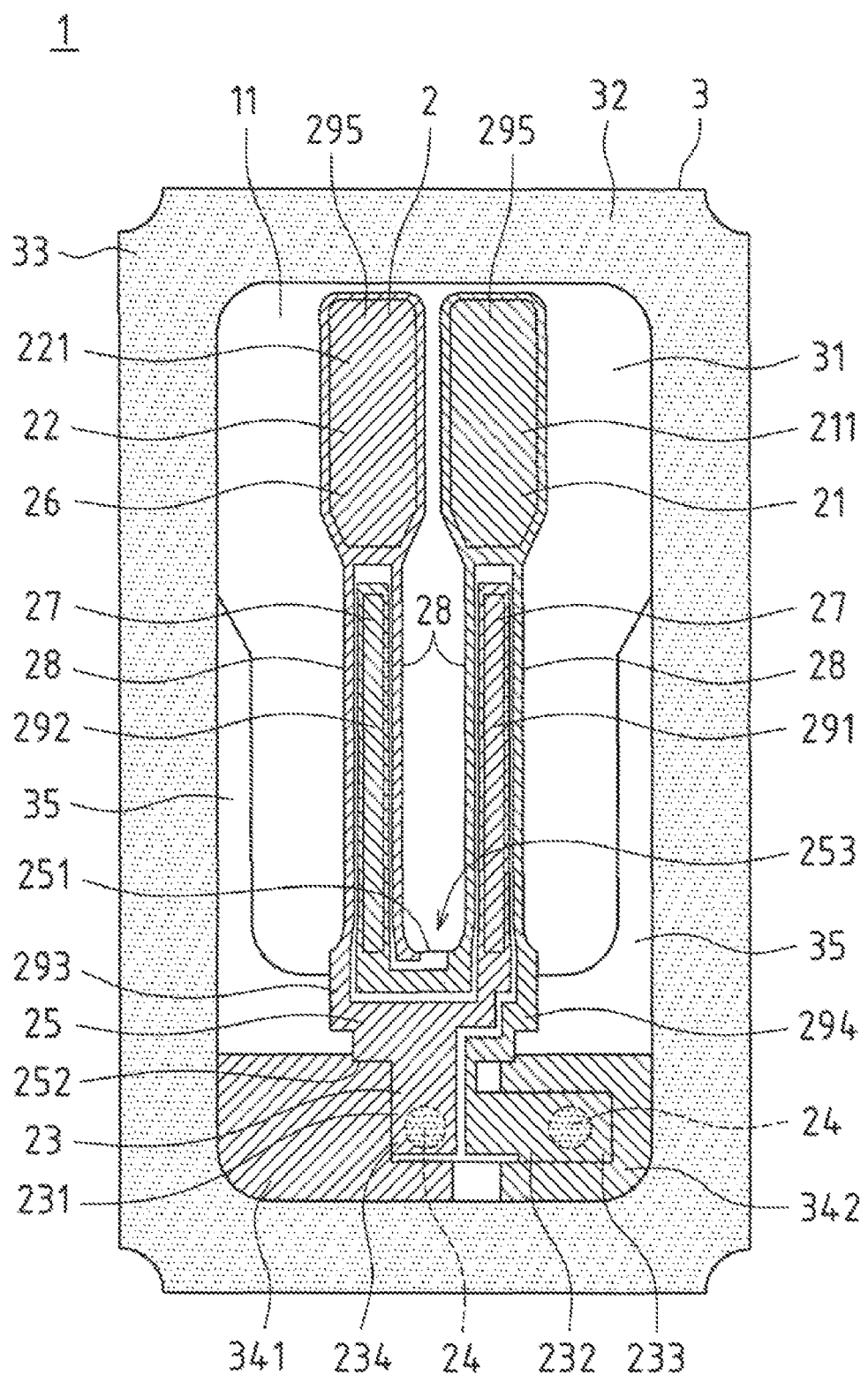
FIG. 1 is a schematic plan view showing the inside of a crystal resonator according to an embodiment of the present invention.

A tuning-fork type crystal resonator 1 according to the present embodiment (hereinafter referred to as "crystal resonator") includes, as shown in FIG. 1, a tuning-fork type crystal resonator plate 2 ("tuning-fork type piezoelectric resonator plate" as referred to in the present invention, hereinafter referred to as "crystal resonator plate") that is shaped by a photolithography method, a base 3 serving as a first sealing member on which the crystal resonator plate 2 is mounted (held), and a lid (not shown) serving as a second sealing member that is used to hermetically seal the crystal resonator plate 2 mounted (held) on the base 3 within a main body casing.

In this crystal resonator 1, the main body casing is formed by bonding the base 3 and the lid. Specifically, the base 3 and the lid are bonded via a sealant (not shown), whereby an inner space 11 is formed in the main body casing. The crystal resonator plate 2 is held and bonded on the base 3 within the inner space 11 of the main body casing via plated bumps 24, and the inner space 11 of the main body casing is hermetically sealed. In this case, the crystal resonator plate 2 is ultrasonically and electromechanically bonded to the base 3 by an FCB method using plated bumps 24 made of a metal material (e.g., gold). Inside the main body casing, an electrode pad 341 is formed larger than an electrode pad 342, which will be described later, as a result of which a first leg portion 21 and a second leg portion 22 of the crystal resonator plate 2 that has an L-shaped bonding portion 23 as viewed from above are disposed closer to the center side of the inner space 11 as viewed from above.

Next, each component of the crystal resonator 1 will be described.

As shown in FIG. 1, the base 3 is formed as a box-like body made up of a bottom portion 31 and a dike portion 32 that extends upward from the bottom portion 31. The dike portion 32 is made of two laminated layers, and a step 35 is provided in the inner space 11. The base 3 is made by placing a rectangular parallelepiped made of a ceramic material on a ceramic material plate having a rectangular shape as viewed from above and fusing them into a single unit with a cavity by firing. The dike portion 32 is shaped along the periphery of the bottom portion 31 shown in FIG. 1 as viewed from above. On the top face of the dike portion 32, a metallization layer 33 for bonding to a lid is provided. The metallization layer 33 is made by applying, for example, onto a tungsten layer or molybdenum layer, nickel plating and gold plating in this order. In the base 3 obtained by firing a laminated ceramic material into a single unit with a cavity, a step 35 is formed to include one end in the longitudinal direction and part of the ends parallel to the longitudinal direction of the inner space 11. In the step 35, as shown in FIG. 1, the electrode pad 341 having a large area as viewed from above and the electrode pad 342 having a small area as viewed from above are formed, and the crystal resonator plate 2 is mounted and held on the electrode pads 341 and 342. The electrode pads 341 and 342 are electrically connected to terminal electrodes (not shown) that are formed on the underside of the base 3 via respectively corresponding routing electrodes (not shown), and the terminal electrodes are connected to external electrodes of an external component or external device. The electrode pads 341 and 342, the routing electrodes, and the terminal electrodes are formed by being fired integrally with the base 3 after printing a metallization material such as tungsten, molybdenum or the like. For some of the electrode pads 341 and 342, the routing electrodes and the terminal electrodes, nickel plating is formed on the top of the metallization, and gold plating is formed on the nickel plating.

The lid is made of, for example, a metal material, and is shaped into a single rectangular plate as viewed from above. In the undersurface of the lid, part of a sealant is formed. The lid is bonded to the base 3 via the sealant by a method such as seam welding, beam welding, hot-melt bonding or the like, as a result of which the main body casing of the crystal resonator 1 including the lid and the base 3 is formed.

Next, each component of the crystal resonator plate 2 provided in the inner space 11 will be described.

The crystal resonator plate 2 is a crystal Z plate formed from a crystal base plate (not shown), which is a crystal plate made of an anisotropic material, by wet-etching. Accordingly, the crystal resonator plate 2 is suitable for mass production.

Figure 2:
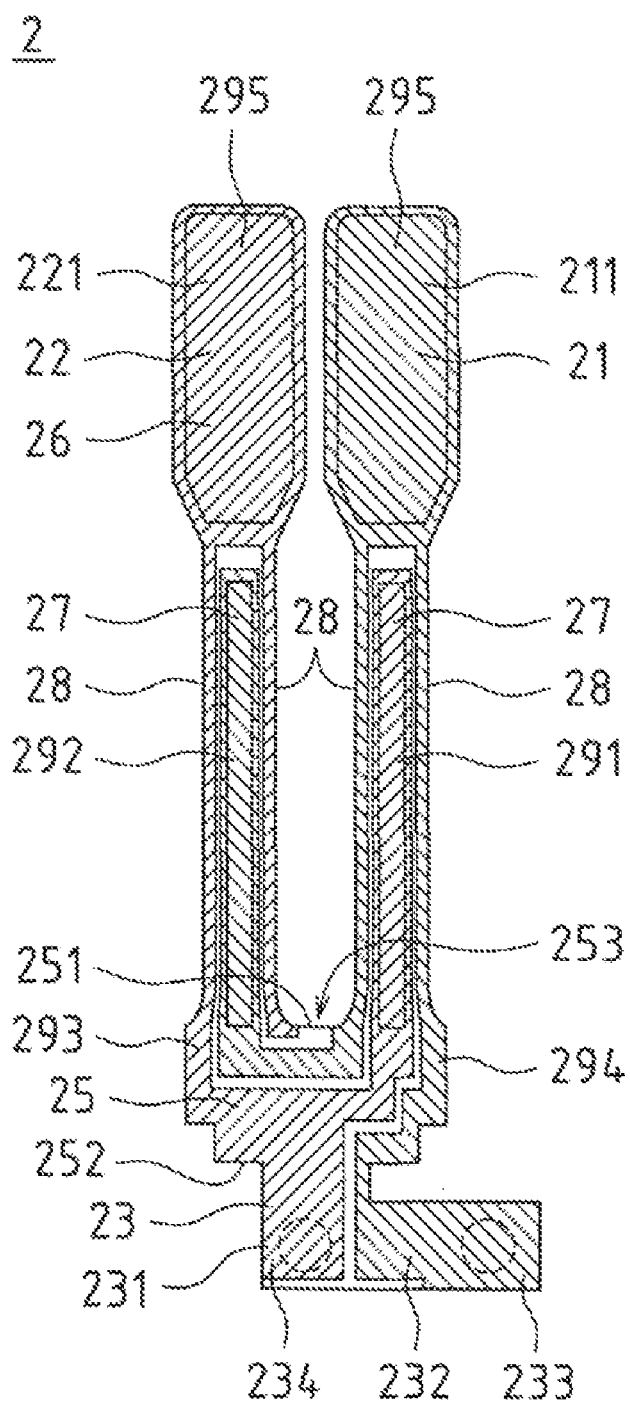
FIG. 2 is a schematic plan view of one primary surface of a crystal resonator plate according to the embodiment of the present invention.
Figure 3:
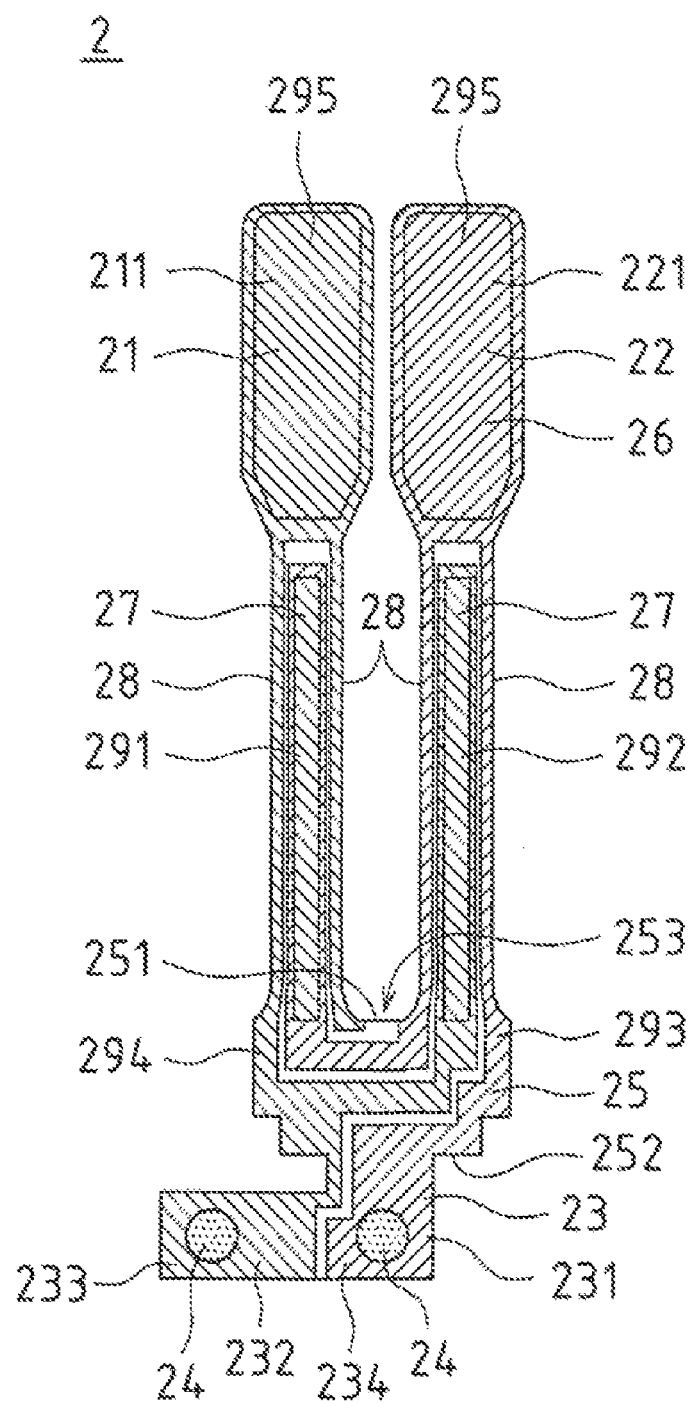
FIG. 3 is a schematic plan view of the other primary surface of the crystal resonator plate according to the embodiment of the present invention.

As shown in FIGS. 1 to 3, the crystal resonator plate 2 has an external configuration including two legs serving as vibrating portions, namely, a first leg portion 21 ("leg portion" as referred to in the present invention) and a second leg portion 22 ("leg portion" as referred to in the present invention), a bonding portion 23 that is bonded to the outside (the electrode pads 341 and 342 of the base 3 in the present embodiment), and a base portion 25 from which the first leg portion 21 and the second leg portion 22 and the bonding portion 23 protrude.

The base portion 25 has a right-and-left symmetrical shape as viewed from above, and is formed wider than the vibrating portions (the first leg portion 21 and the second leg portion 22) as shown in FIG. 1. In addition, the vicinity of a second end portion 254 (see a second end face 252) of the base portion 25 is formed in a stair-step configuration such that the base portion 25 tapers from a first end face 251 to the second end face 252.

The two legs, namely, the first leg portion 21 and the second leg portion 22 are provided side-by-side with a gap 253 interposed therebetween and protruding from the first end face 251 of the base portion 25 as shown in FIG. 1. The gap 253 as used herein is provided in a center position (center region) in the width direction of the first end face 251. A distal end portion 211 of the first leg portion 21 and a distal end portion 221 of the second leg portion 22 are shaped wider than other parts of the first leg portion 21 and the second leg portion 22 in the direction perpendicular to the protruding direction, and each corner is curved. By shaping wide distal end portions 211 and 221 as described above, it is possible to make efficient use of the distal end portions 211 and 221 (distal end regions), and make a contribution to miniaturization of the crystal resonator plate 2 and the frequency reduction. In addition, by making each corner of the distal end portions 211 and 221 curved, it is possible to prevent the distal end portions 211 and 221 from coming into contact with the dike portion 32 or the like when an external force is applied.

In both primary surfaces 26 (a topside primary surface and an underside primary surface) of the two legs, namely, the first leg portion 21 and the second leg portion 22, grooves 27 are formed in order to improve resonance resistance value (referred to as a "CI value" in the present embodiment, the same applies hereinafter) that would otherwise be deteriorated due to miniaturization of the crystal resonator plate 2. In the external configuration of the crystal resonator plate 2, a side face 28 is shaped at an incline with respect to both primary surfaces 26. This is because the etching speed of a substrate material in crystal directions (X axis and Y axis directions) when shaping the crystal resonator plate 2 by wet-etching is different.

The bonding portion 23 is provided in order to electromechanically bond lead electrodes 293 and 294, which will be described below, to external electrodes ("the outside" as referred to in the present invention: the electrode pads 341 and 342 of the base 3 in the present embodiment) as shown in FIG. 1. Specifically, the bonding portion 23 is formed protruding from the second end face 252 at the center position (center region) in the width direction of the first end face 251 of the base portion 25 between the first leg portion 21 and the second leg portion 22, the second end face 252 being located opposite the first end face 251 of the base portion 25, from which the two legs, namely, the first leg portion 21 and the second leg portion 22 protrude. In other words, the bonding portion 23 is formed in a protruding manner at a position that is exactly opposite the gap 253 provided between the two legs, namely, the first leg portion 21 and the second leg portion 22. Because the bonding portion 23 protrudes from the second end face 252 at the position that is exactly opposite the gap 253 provided between the two legs, namely, the first leg portion 21 and the second leg portion 22, the substantial distances (straight line distances) from the bonding portion 23 to the first leg portion 21 and the second leg portion 22 are the same.

The bonding portion 23 includes a short-side portion 231 (corresponding to "base end portion of the bonding portion" as referred to in the present invention) that protrudes perpendicularly to the second end face 252 of the base portion 25 as viewed from above, and a long-side portion 232 (corresponding to "distal end portion of the bonding portion" as referred to in the present invention) that is connected to and bent with respect to the extremity of the short-side portion 231 at the right angle as viewed from above and extends in the width direction of the base portion 25. The distal end portion 233 of the bonding portion 23 runs in the width direction of the base portion 25. In other words, the bonding portion 23 is shaped into an L shape as viewed from above, and a corner portion 234, which is the bent part of the L-shaped bonding portion 23 as viewed from above, corresponds to the extremity of the short-side portion 231. In the present embodiment, the extending direction of the long-side portion 232, which is the protruding direction of the bonding portion 23, is the −X axis direction. Accordingly, a side face of the bonding portion 23 is shaped at an incline with respect to both primary surfaces 26 when the crystal resonator plate 2 is shaped by wet-etching. With the inclined side face of the bonding portion 23, the strength of the bonding portion can be increased.

In the present embodiment, the corner portion 234 of the short-side portion 231 serving as a base end portion of the bonding portion 23 is used as a bond region bonded to the outside, and the extremity of the long-side portion 232 serving as a distal end portion 233 of the bonding portion 23 is used as a bond region bonded to the outside. And, in the short-side portion 231 serving as a base end portion of the bonding portion 23, a lead electrode 293 drawn out from a first driving electrode 291 ("one of the driving electrodes" as referred to in the present invention), which will be described below, is formed, and in the long-side portion 232 serving as a distal end portion of the bonding portion, a lead electrode 294 drawn out from a second driving electrode 292 ("the other of the driving electrodes" as referred to in the present invention), which will be described below, is formed.

Specifically, in one of the primary surfaces 26 of the bonding portion (the underside primary surface in FIG. 1), two plated bumps 25 that are to be bonded to the base 3 are formed. More specifically, a first plated bump 25 is formed in the corner portion 234 of the bonding portion 23, and a second plated bump 25 is formed in the distal end portion 233 of the bonding portion 23.

As to the formation of plated bumps 24 in the bonding portion 23, plated bumps 24 are formed through plating in the bonding portion 23 by a method such as an electrolytic plating method, and the formed plated bumps are formed into a desired shape (a circular shape such as a circle as viewed from above or an ellipse as viewed from above, or a polygonal shape such as a rectangle as viewed from above or a square as viewed from above) through metal etching by a photolithography method, and then annealed. Specifically, one plated bump 24 is formed in each of the corner portion 234 and the distal end portion 233 of the bonding portion 23, and after that, the plated bumps 24 are annealed.

By using such plated bumps 24 as bumps, it is possible to electromechanically bond the crystal resonator plate 2 to the base 3 via the plated bumps 24 in a stable manner. Specifically, by using such plated bumps 24 as bumps, it is possible to form the plated bumps 24 on the crystal resonator plate 2 before mounting it onto the outside (the base 3). As a result, because the plated bumps 24 are formed in the desired position of the crystal resonator plate 2 every time, even if, for example, the crystal resonator plate 2 is mounted onto the outside (the base 3) at a position different from the desired position, it is possible to prevent the crystal resonator plate 2 from being mounted onto the outside (the base 3) with the bumps being displaced, as a result of which the crystal resonator plate 2 can be mounted onto the base 3 in a stable manner.

The crystal resonator plate 2 of the present embodiment also includes: two electrodes having different potentials, namely, a first driving electrode 291 and a second driving electrode 292; and lead electrodes 293 and 294 that are drawn out from the first driving electrode 291 and the second driving electrode 292 in order to electrically connect the first driving electrode 291 and the second driving electrode 292 to the electrode pads 341 and 342. The lead electrodes 293 and 294 as referred to in the present embodiment refer to electrode patterns drawn out from the two electrodes, namely, the first driving electrode 291 and the second driving electrode 292.

In addition, the two electrodes, namely, the first driving electrode 291 and the second driving electrode 292 are partly formed inside the grooves 27. Accordingly, even when the crystal resonator plate 2 is miniaturized, the vibration loss in the first leg portion 21 and the second leg portion 22 is suppressed, and therefore the CI value can be kept low.

The first driving electrode 291 is formed in both primary surfaces 26 (the topside primary surface and the underside primary surface) of the first leg portion 21 and both side faces 28 of the second leg portion 22. Similarly, the second driving electrode 292 is formed in both primary surfaces 26 (the topside primary surface and the underside primary surface) of the second leg portion 22 and both side faces 28 of the first leg portion 21.

The first driving electrode 291 and the second driving electrode 292 and the lead electrodes 293 and 294 of the crystal resonator plate 2 described above are a thin film obtained by forming a chromium layer on each of the first leg portion 21 and the second leg portion 22 by metal deposition and then forming a metal layer on the chromium layer. The thin film is metal-etched into the desired shape by a photolithography method after being formed over the entire substrate by a method such as a vacuum vapor deposition method. The first driving electrode 291, the second driving electrode 292 and the lead electrodes 293 and 294 are formed of a chromium layer and a gold layer formed in this order, but it is also possible to form these electrodes, for example, in the order of chromium and silver, in the order of chromium, gold and chromium, in the order of chromium, silver and chromium, or the like.

In each of the distal end portions 211 and 221 of the first leg portion 21 and the second leg portion 22, a metal film 295 is formed as a weight for adjusting the frequency. Specifically, a metal film 295, the first driving electrode 291 and the lead electrode 293 are combined into one, and a metal film 295, the second driving electrode 292 and the lead electrode 294 are combined into one.

The crystal resonator plate 2 provided in the crystal resonator 1 of the present embodiment described above can prevent acoustic leak, have resistance to stress and external forces, prevent the occurrence of defects such as cracks in the crystal resonator plate 2, and is suitable for miniaturization.

Specifically, according to the present embodiment, the crystal resonator plate 2 includes two legs, namely, a first leg portion 21 and a second leg portion 22, a bonding portion 23 and a base portion 25, the first leg portion 21 and the second leg portion 22 protrude from a first end face 251 of the base portion 25 and are provided side-by-side on the first end face 251, the bonding portion 23 protrude from a second end face 252 located opposite the first end face 251 of the base portion 25, the bonding portion 23 protruding from the second end face 252 at a position located opposite the center position between the first leg portion 21 and the second leg portion 22 in the width direction of the first end face 251 of the base portion 25, and at least a short-side portion 231 serving as a base end portion of the bonding portion 23 is used as a bond region bonded to the outside (electrode pads 341 and 342 in the present embodiment), and therefore it is possible to achieve a configuration that is resistant to stress and external forces since the base end portion of the bonding portion 23 in the vicinity of the base portion 25 is used as a bond region bonded to the electrode pads 341 and 342.

In addition, because the bonding portion 23 protrudes from the position opposite the center position between the first leg portion 21 and the second leg portion 22 in the width direction of the first end face 251 of the base portion 25, it is possible to prevent acoustic leak. A situation can occur such as, for example, an oscillation frequency deviation occurs due to bonding the crystal resonator plate 2 to other members such as mounting it onto the electrode pads 341 and 342, or due to the application of external forces to the crystal resonator plate 2. However, according to the present embodiment, such a situation will not occur.

In addition, according to the present embodiment, it is possible to not only reduce harmful effects of acoustic leak, but also to widen the bonding portion 23. In this case, even if external forces (e.g., an external force applied to the crystal resonator plate 2 by the crystal resonator plate 2 being dropped) are applied to the crystal resonator plate 2, it is possible to suppress the occurrence of physical and electrical breaks in the bonding portion 23. As a result, according to the present embodiment, it is possible to improve the durability such as, for example, impact resistance.

In addition, particularly because the short-side portion 231 serving as a base end portion of the bonding portion 23 and the long-side portion 232 serving as a distal end portion of the bonding portion 23 are used as a bond region bonded to the electrode pads 341 and 342, the first driving electrode 291 is formed in the short-side portion 231 of the bonding portion 23, and the second driving electrode 292 is formed in the long-side portion 232 of the bonding portion 23, it is possible to prevent short-circuiting from occurring in the bond region bonded to the electrode pads 341 and 342. Furthermore, by defining such a bond region in the short-side portion 231 and the long-side portion 232 of the bonding portion 23, it is possible to achieve a configuration that prevents acoustic leak and is resistant to stress and external forces.

Also, because the bonding portion 23 is formed into an L shape as viewed from above, the overall length and width as viewed from above of the crystal resonator plate 2 can be reduced, contributing to miniaturization of the main body casing of the crystal resonator plate 2. Furthermore, in the case where a plurality of crystal resonator plates 2 are formed from a single wafer, the number of crystal resonator plates 2 produced from a single wafer can be increased. It is also possible to suppress the deformation of the crystal resonator plate 2 in the thickness direction when an external force such as an impact is applied from the outside, so that when the crystal resonator plate 2 is mounted onto an external member (a crystal resonator 1 including a base 3 and a lid), it is possible to prevent the crystal resonator plate 2 from coming into contact with the external member. As a result, the first leg portion 21 and the second leg portion 22 can be prevented from chipping or the like due to coming into contact with the external member, and the oscillation frequency can be prevented from varying. In addition, leaking vibrations generated by the vibrations of the first leg portion 21 and the second leg portion 22 are confined to the bent part of the L-shaped bonding portion 23 as viewed from above (the corner portion 234 in the present embodiment), making it difficult for the vibrations to be transmitted to the distal end portion 233 of the bonding portion 23 and further reducing the acoustic leak.

Also, because a bond region bonded to the outside is formed in the corner portion 234 and the distal end portion 233 of the bonding portion 23, leaking vibrations generated by the vibrations of the first leg portion 21 and the second leg portion 22 are confined to the corner portion 234, and the transmission of the vibrations to the distal end portion 233 is suppressed, as a result of which the acoustic leak can be further reduced.

Also, because the base portion 25 is formed to have a right-and-left symmetrical shape as viewed from above, and the second end portion 254 of the base portion 25 is formed such that the base portion 25 tapers from the first end face 251 side to the second end face 252 side along the overall length direction of the base portion 25, leaking vibrations generated by the vibrations of the first leg portion 21 and the second leg portion 22 serving as vibrating portions can be attenuated by the second end face 252, and the transmission of the leaking vibrations to the bonding portion 23 can be suppressed, and thus this configuration is preferable to further reduce the acoustic leak (vibration leak).

Also, because plated bumps 24 are formed in the short-side portion 231 serving as a base end portion of the bonding portion 23 and the long-side portion 232 serving as a distal end portion of the bonding portion 23, which are used as bond regions, the positioning accuracy when forming the plated bumps 24 in the crystal resonator plate 2 can be increased, and even when the bonding portion 23 of the crystal resonator plate 2 is reduced in size, the plated bumps 24 can be formed at an appropriate position of the crystal resonator plate 2 as bonding members. In addition, the plated bumps 24 can be formed simultaneously with the formation of other metal materials (e.g., the first driving electrode 291, the second driving electrode 292, the lead electrodes 293 and 294, etc.) of the crystal resonator plate 2.

According to the present embodiment, because the crystal resonator plate 2 is bump-bonded to the base 3 with the use of the plated bumps 24, the influence of outgas generated during bonding can be eliminated, and the increase of the internal pressure of the inner space 11 of the casing of the crystal resonator 1 can be suppressed.

Figure 4:
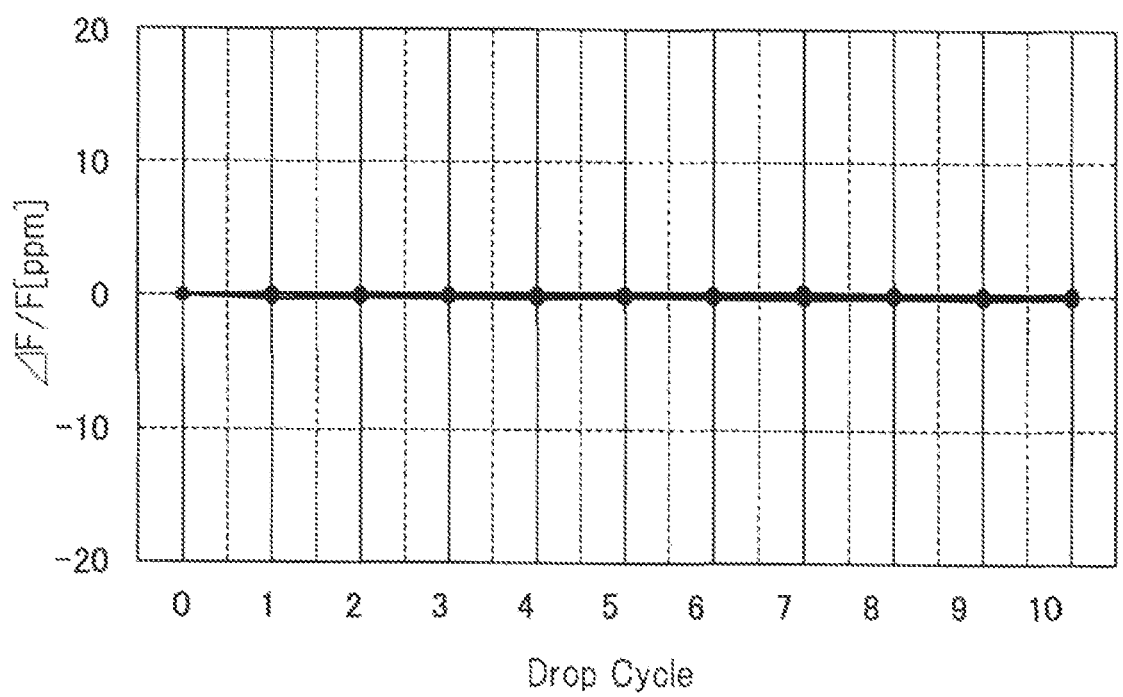
FIG. 4 is a graph diagram showing the results of a drop test of the crystal resonator according to the embodiment of the present invention.

Next, a drop test was performed on the crystal resonator 1 mounting the crystal resonator plate 2 of the present embodiment thereon. The results are shown in FIG. 4. Specifically, the drop test was performed 10 cycles on six crystal resonators 1.

Figure 5:
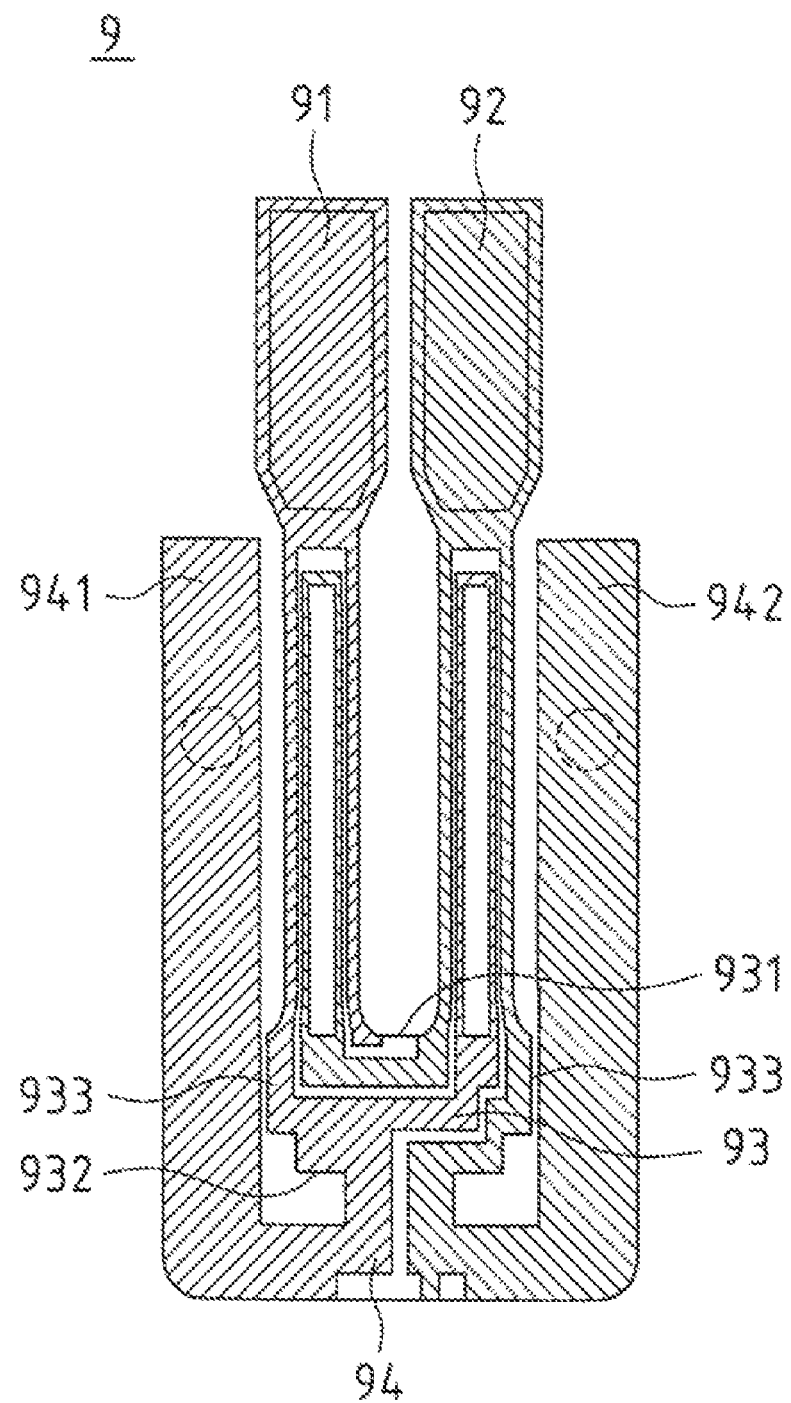
FIG. 5 is a schematic plan view of one primary surface of a crystal resonator plate according to a comparative example of the present invention.
Figure 6:
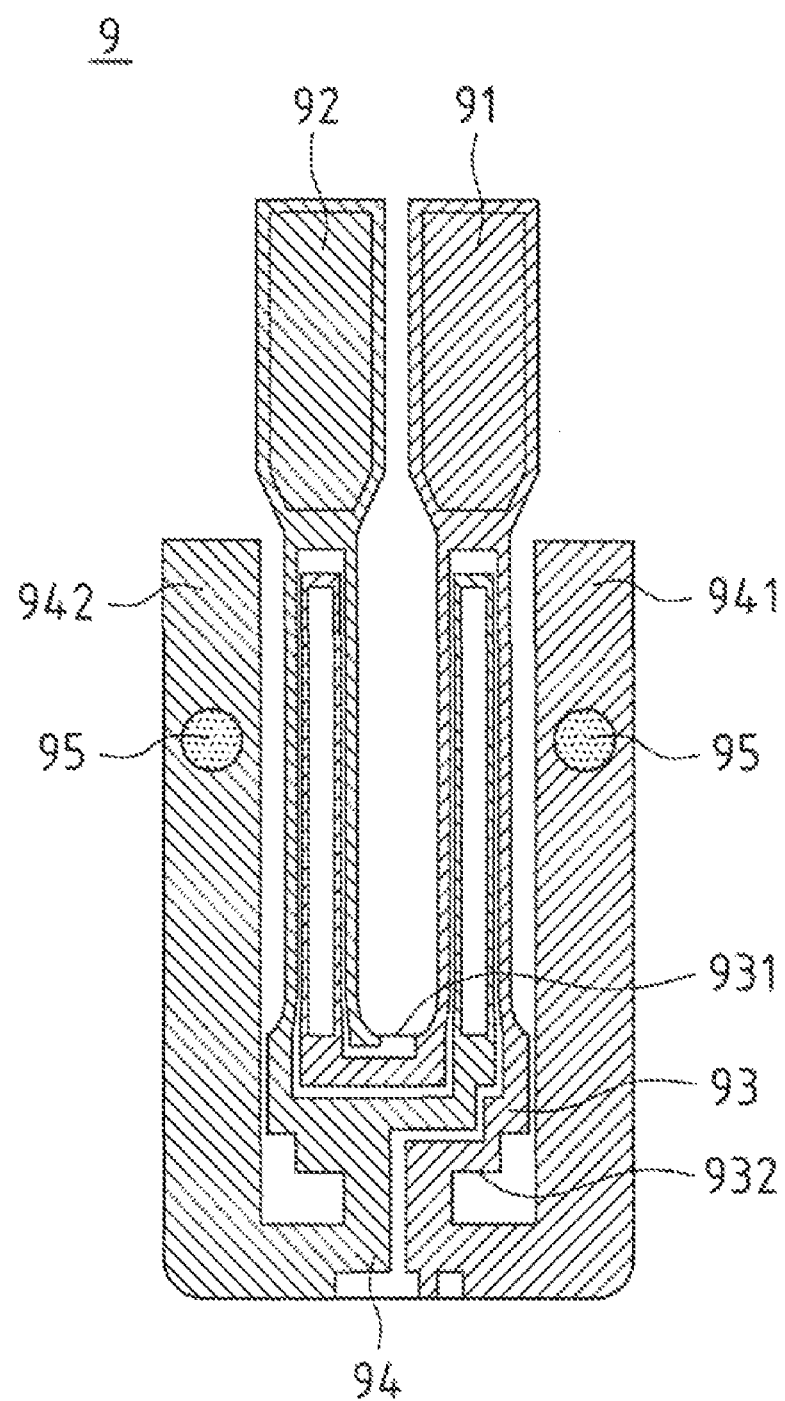
FIG. 6 is a schematic plan view of the other primary surface of the crystal resonator plate according to the comparative example of the present invention.

For comparison with the drop test results of the present embodiment, a crystal resonator (hereinafter referred to as a comparative example) on which a crystal resonator plate having the same configuration as that of the above-described conventional technology was mounted was used. The crystal resonator plate 9 according to the comparative example is different from the configuration of the present embodiment in terms of the shape of the distal end portions of the first leg portion and the second leg portion and the shape of the bonding portions as shown in FIGS. 5 and 6. Specifically, in the crystal resonator plate 9 of the comparative example, a bonding portion 94 is formed protruding from a second end face 932 located opposite a first end face 931 of a base portion 93 from which two legs, namely a first leg portion 91 and a second leg portion 92 protrude, and the bonding portion 94 is shaped to extend from the second end face 932 of the base portion 93 and branch into two directions toward both side faces 933 so as to form a T shape, and respective distal end portions 941 and 942 are formed by being bent so as to extend in the same direction as the two legs, namely, the first leg portion 91 and the second leg portion 92 that are formed protruding from the first end face 931 of the base portion 93. In FIGS. 5 and 6, reference numeral 95 denotes a plated bump.

In this comparative example as well, a drop test was performed 10 cycles on six crystal resonators under the same conditions as those of the present embodiment. The results are shown in FIG. 7.

Figure 7:
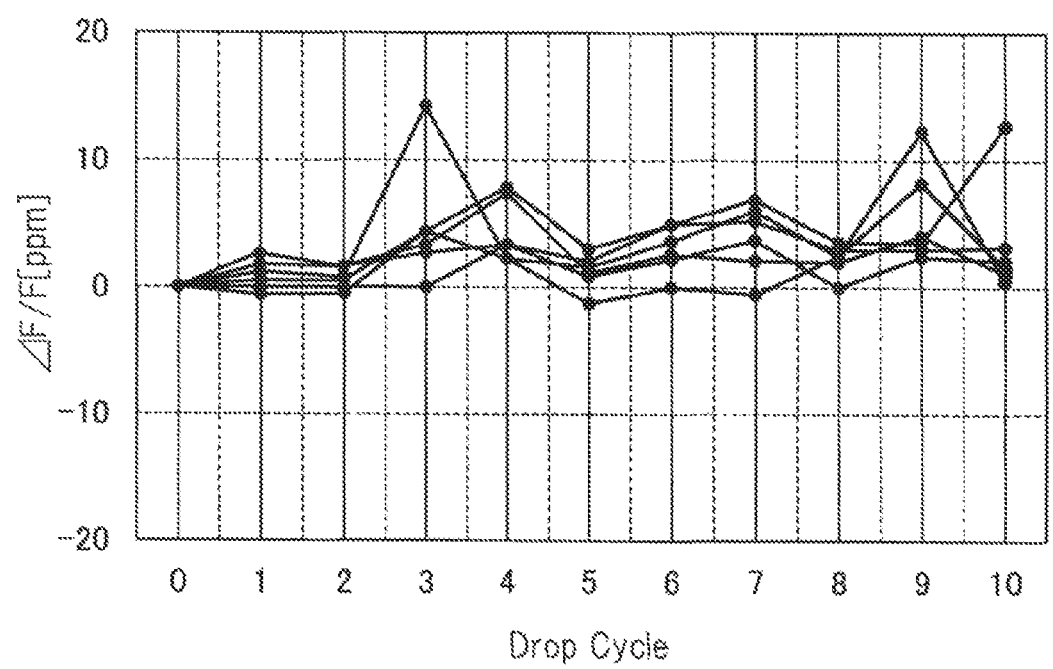
FIG. 7 is a graph diagram showing the results of a drop test of the crystal resonator according to the comparative example of the present invention.

As can be clearly seen from the comparison of the drop test results between the crystal resonator 1 of the present embodiment and the crystal resonator of the comparative example shown in FIGS. 4 and 7, there are differences in the amount of variation of oscillation frequency due to external forces (drop impacts) between the present embodiment and the comparative example. In the test results of the present embodiment shown in FIG. 4, no variations are observed in the oscillation frequency. In other words, no oscillation frequency deviation occurred. In contrast, in the test results of the comparative example shown in FIG. 7, variations are observed in the oscillation frequency.

From the foregoing, it is clear that the configuration according to the present embodiment can prevent acoustic leak and have resistance to stress and external forces as compared to the conventional technology represented by the comparative example.

Figure 8:
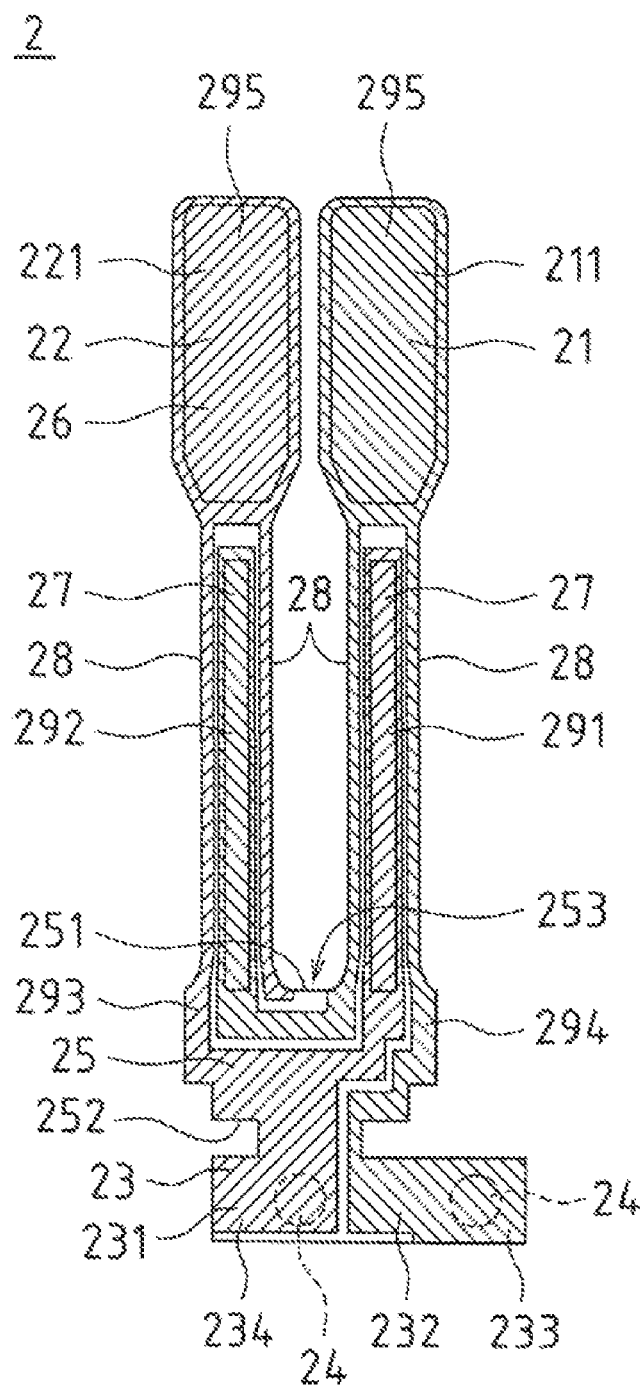
FIG. 8 is a schematic plan view of one primary surface of a crystal resonator plate according to another embodiment of the present invention.
Figure 9:
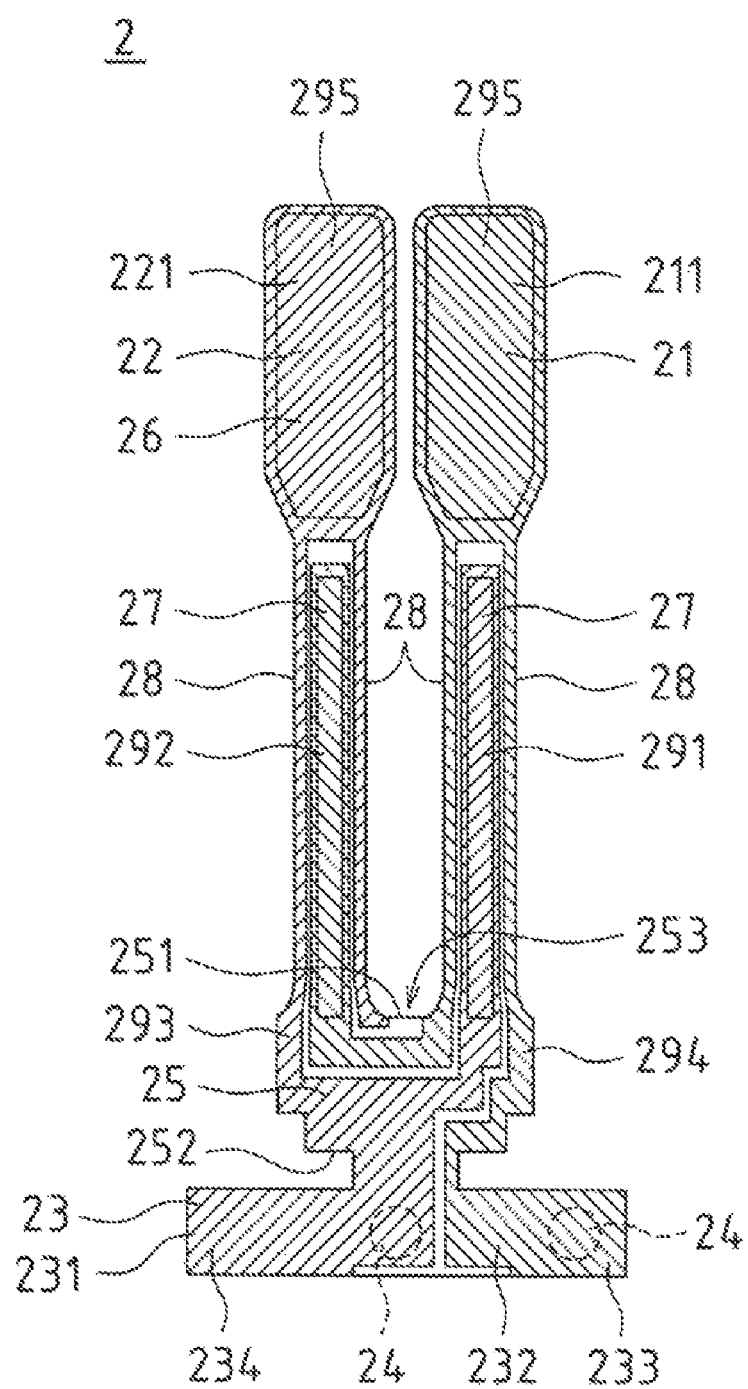
FIG. 9 is a schematic plan view of one primary surface of a crystal resonator plate according to another embodiment of the present invention.

In the present embodiment, the bonding portion 23 is shaped into an L shape as viewed from above, but the present invention is not limited thereto. As long as the crystal resonator plate 2 is bonded to the base 3 at the short-side portion 231 of the bonding portion 23, the bonding portion 23 may be shaped into a substantially L shape as viewed from above as shown in FIG. 8. Alternatively, the bonding portion 23 may be shaped into a T shape as viewed from above as shown in FIG. 9.

Figure 10:
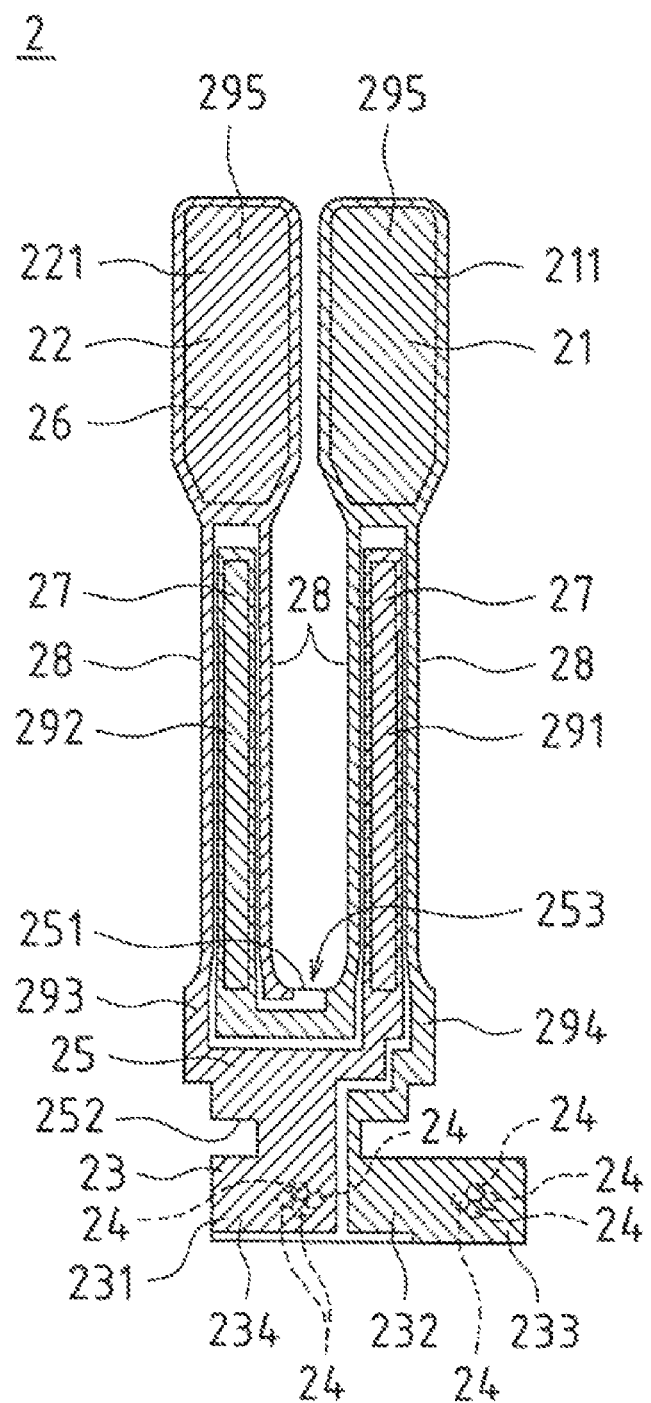
FIG. 10 is a schematic plan view of one primary surface of a crystal resonator plate according to another embodiment of the present invention.

Also, in the present embodiment, the corner portion 234 of the short-side portion 231 serving as a base end portion of the bonding portion 23 and the extremity of the long-side portion 232 serving as a distal end portion 233 of the bonding portion 23 are used as a bond region bonded to the outside, and one plated bump 24 is formed in each of the corner portion 234 of the short-side portion 231 and the extremity of the long-side portion 232. However, the number of plated bumps 24 is not limited to that of the present embodiment. A plurality of plated bumps 24 may be formed in at least one of the corner portion 234 of the short-side portion 231 and the extremity of the long-side portion 232. For example, four plated bumps 24 may be formed in each of the corner portion 234 of the short-side portion 231 and the extremity of the long-side portion 232 as shown in FIG. 10.

Figure 11:
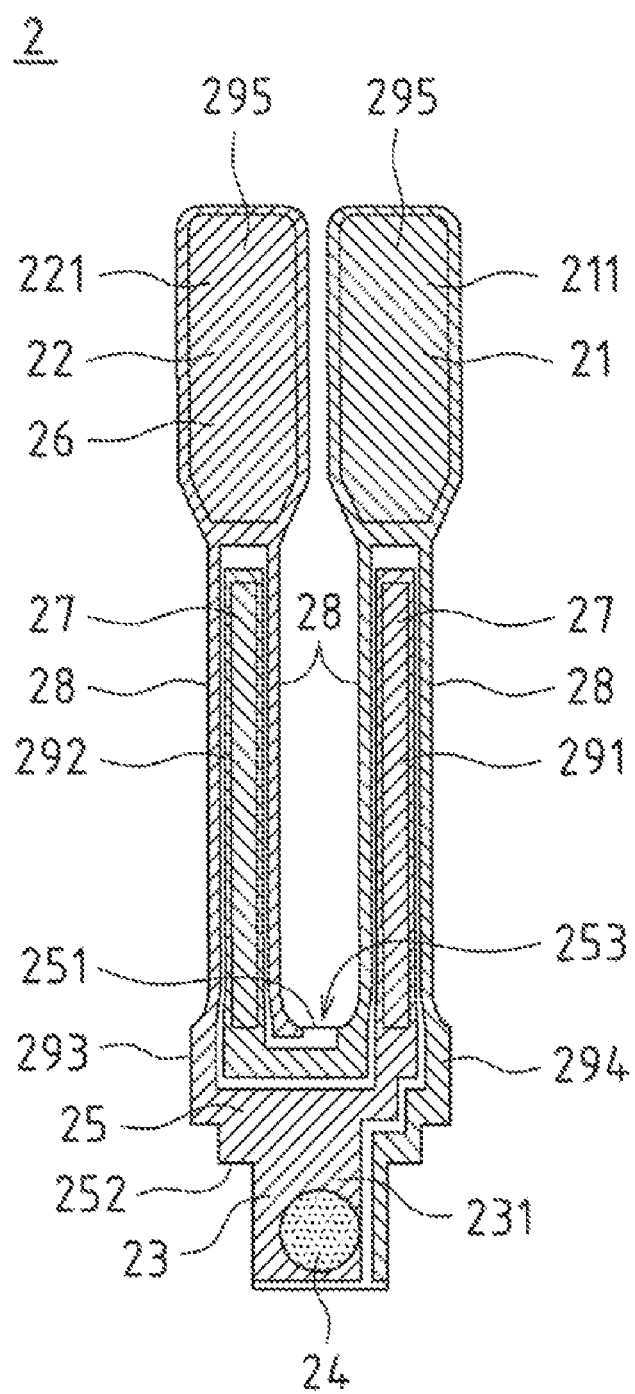
FIG. 11 is a schematic plan view of one primary surface of a crystal resonator plate according to another embodiment of the present invention.
Figure 12:
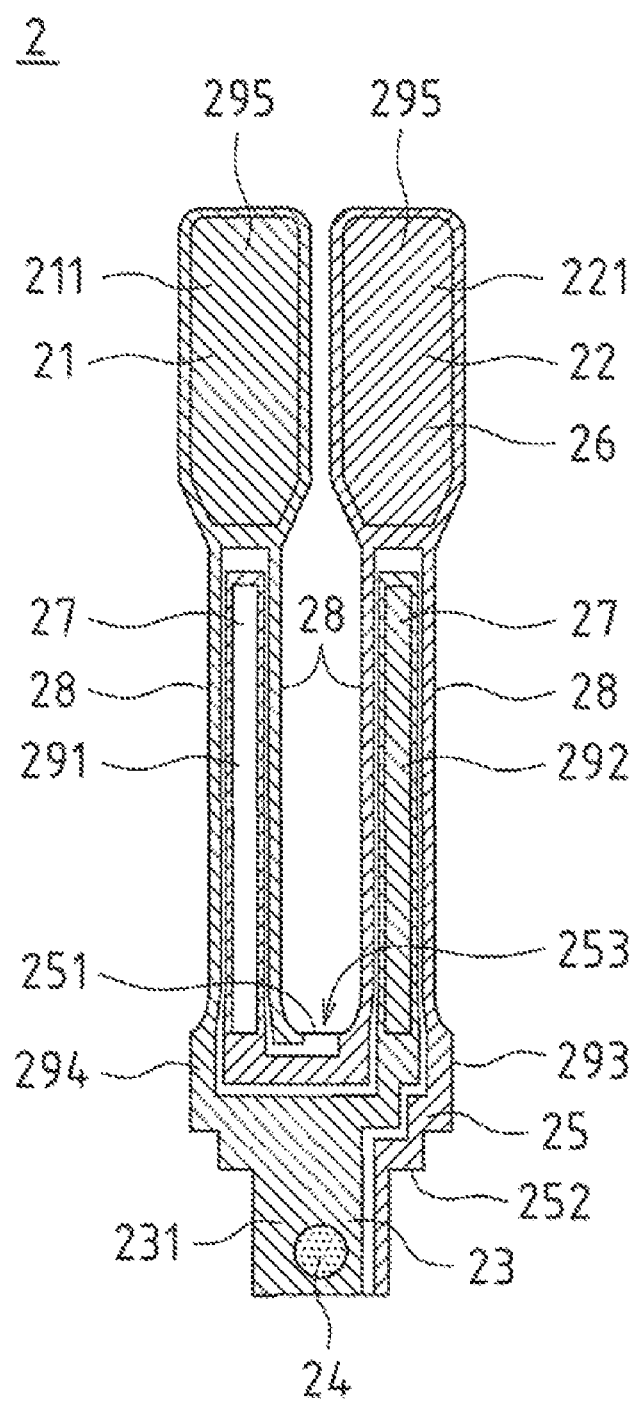
FIG. 12 is a schematic plan view of the other primary surface of the crystal resonator plate according to another embodiment of the present invention.

Also, in the present embodiment, the bonding portion 23 is shaped into an L shape as viewed from above, but the present invention is not limited thereto. As shown in FIGS. 11 and 12, the bonding portion 23 may be configured only of a short-side portion 231 as referred to in the present embodiment. FIG. 11 is a schematic plan view of a first primary surface 26 of a crystal resonator plate 2, and FIG. 12 is a schematic plan view of a second primary surface 26 of the crystal resonator plate 2. In an embodiment shown in FIGS. 11 and 12, both primary surfaces 26 of the short-side portion 231 serving as a base end portion of the bonding portion 23 are used as bond regions bonded to the outside (electrode pads 341 and 342 in the present embodiment). In addition, as shown in FIGS. 11 and 12, a lead electrode 293 drawn out from a first driving electrode 291 is formed on the first primary surface 26 of the short-side portion 231 of the bonding portion 23 of the crystal resonator plate 2, and a lead electrode 294 drawn out from a second driving electrode 292 is formed on the second primary surface 26 of the short-side portion 231 the bonding portion 23 of the crystal resonator plate 2.

Figure 13:
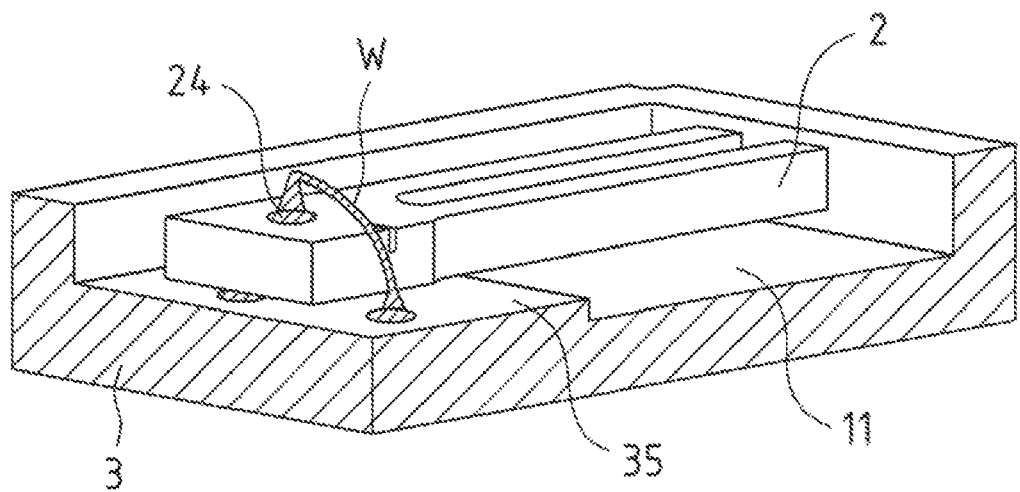
FIG. 13 is a schematic perspective view showing the inside of a crystal resonator according to another embodiment of the present invention.

The crystal resonator plate 2 shown in FIGS. 11 and 12 is mounted onto a base 3 as shown in FIG. 13. In the embodiment shown in FIG. 13, the crystal resonator plate 2 is disposed such that the second primary surface 26 of the crystal resonator plate 2 shown in FIG. 12 faces the base 3, and the crystal resonator plate 2 is ultrasonically and electromechanically bonded to the base 3 by an FCB method using a plated bump 24 formed on the second primary surface 26 of the bonding portion 23 of the crystal resonator plate 2. The crystal resonator plate 2 is also wire-bonded to the base 3 with the first primary surface 26 of the bonding portion 23 of the crystal resonator plate 2 shown in FIG. 11 being bonded to the base 3 with a wire W, and is electromechanically bonded to the base 3.

With the crystal resonator plate 2 shown in FIGS. 11 and 12, because both primary surfaces 26 of the short-side portion 231 serving as a base end portion of the bonding portion 23 are used as bond regions bonded to the outside, it is possible to prevent the overall length and width as viewed from above of the crystal resonator plate 2 from increasing while reducing acoustic leak, contributing to miniaturization of the main body casing of the crystal resonator plate 2. As a result, in the case where a plurality of crystal resonator plates 2 are formed from a single wafer, the number of crystal resonator plates 2 produced from a single wafer can be increased.

Figure 14:
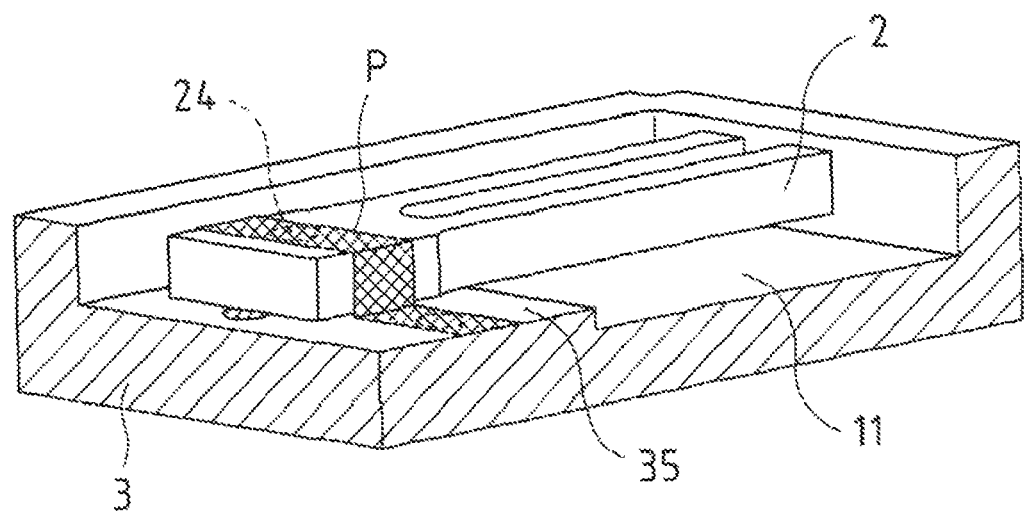
FIG. 14 is a schematic perspective view showing the inside of a crystal resonator according to another embodiment of the present invention.

The crystal resonator plate 2 shown in FIGS. 11 and 12 may be mounted and bonded to a base 3 by being sandwiched between a plate P and the base 3 as shown in FIG. 14. In this case, the crystal resonator plate 2 is disposed such that the second primary surface 26 of the crystal resonator plate 2 shown in FIG. 12 faces the base 3, and the crystal resonator plate 2 is ultrasonically and electromechanically bonded to the base 3 by an FCB method using the plated bump 24 formed on the second primary surface 26 of the bonding portion 23 of the crystal resonator plate 2. In addition, the crystal resonator plate 2 is ultrasonically bonded to the plate P by an FCB method using the plated bump 24 formed on the first primary surface 26 of the bonding portion 23 of the crystal resonator plate 2 shown in FIG. 11, and the bonding portion 23 is electrically bonded to the base 3 by a conductive portion (not shown) formed in the plate P.

Figure 15:
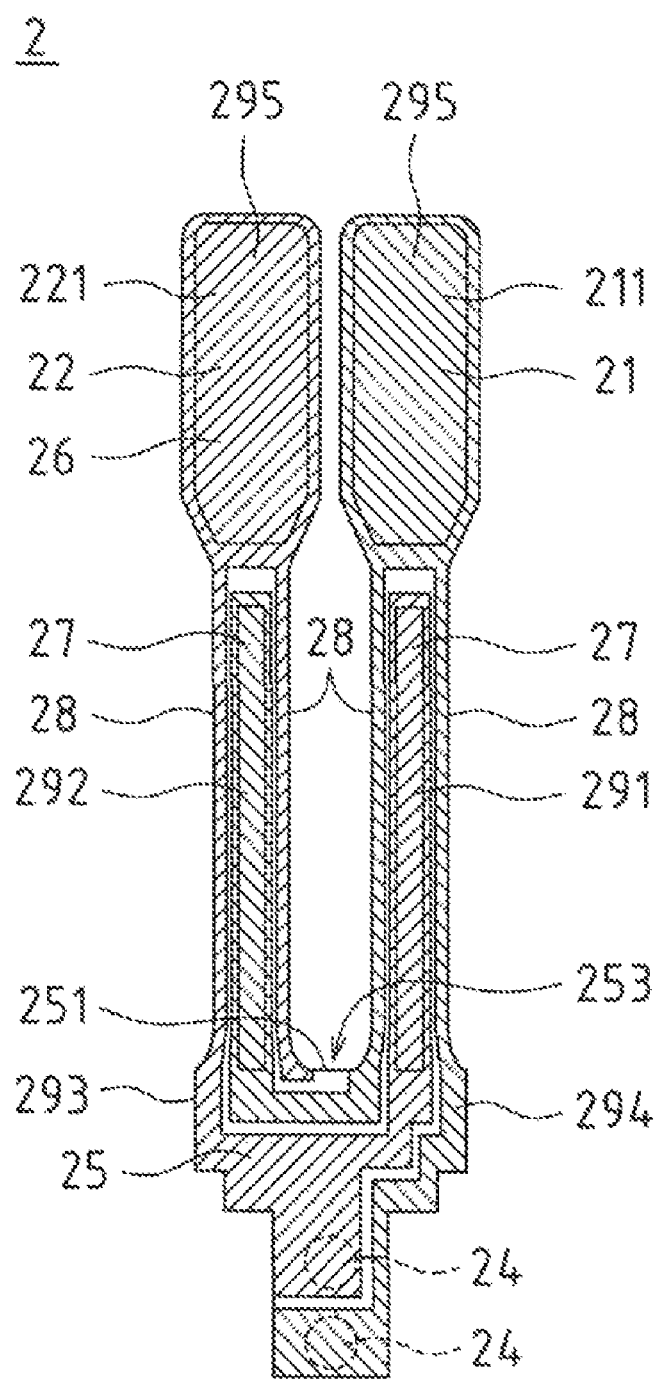
FIG. 15 is a schematic plan view of one primary surface of a crystal resonator plate according to another embodiment of the present invention.

In the above-described crystal resonator plate 2 shown in FIGS. 11 and 12, both primary surfaces 26 of the short-side portion 231 serving as a base end portion of the bonding portion 23 are used as bond regions bonded to the outside, but it is also possible to form two plated bumps 24 side-by-side on one primary surface 26 of the short-side portion 231 serving as a base end portion of the bonding portion 23 as shown in FIG. 15.

In the present embodiment, quartz is used as a piezoelectric material, but this is merely a preferable example, and thus the present invention is not limited thereto. It is also possible to use piezoelectric materials other than quartz such as, for example, lithium tantalate, lithium niobate, etc.

For the base 3 as referred to in the present embodiment, a ceramic material is used, but the present invention is not limited thereto; quartz or glass may be used.

The groove 27 as referred to in the present embodiment has an angled U-shaped cross section as shown in FIG. 1, but the present invention is not limited thereto; it may be a dent.

Also, in the present embodiment, the groove 27 is formed in the first leg portion 21 and the second leg portion 22, but this is merely a preferable example. In this case, because the groove is formed in a primary surface 26 of at least one of the first leg portion 21 and the second leg portion 22 serving as vibrating portions, it is possible to improve the resonance resistance value (referred to as the "CI value" in the present embodiment), which would otherwise be deteriorated due to miniaturization of the crystal resonator plate 2. However, where it is unnecessary to improve the CI value, the present invention is also applicable to, for example, a crystal resonator plate 2 in which the groove is not formed in the first leg portion 21 and the second leg portion 22.

Also, in the present embodiment, the groove 27 is formed in both primary surfaces 26 of each of the first leg portion 21 and the second leg portion 22, but this is merely a preferable example, and the present invention is not limited thereto; the effect produced by forming a groove 27 can be obtained even when the groove 27 is formed in either one of the primary surfaces 26.

Also, in the present embodiment, plated bumps 24 are used as bumps, but the present invention is not limited thereto; it is also possible to use stud bumps.

Also, in the present embodiment, the first leg portion 21 and the second leg portion 22 are used as vibrating portions, but the number of leg portions is not limited to two.

Also, in the present embodiment, the main body casing is made up of a base 3 and a lid, but the present invention is not limited thereto; the main body casing may be made up of two bases 3 as long as the first driving electrode 291 and second driving electrode 292 of the crystal resonator plate 2 can be sealed by members that correspond to the first sealing member and second sealing member as referred to in the present invention, and the configuration does not matter.

Figure 16:
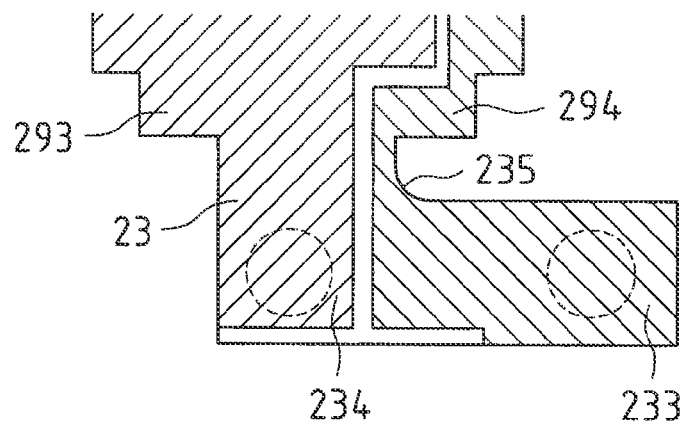
FIG. 16 is an enlarged schematic plan view of a bonding portion of a crystal resonator plate according to another embodiment of the present invention.
Figure 17:
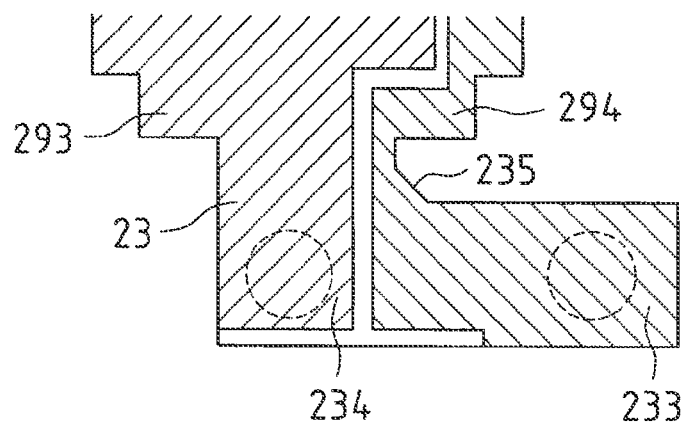
FIG. 17 is an enlarged schematic plan view of a bonding portion of a crystal resonator plate according to another embodiment of the present invention.
Figure 18:
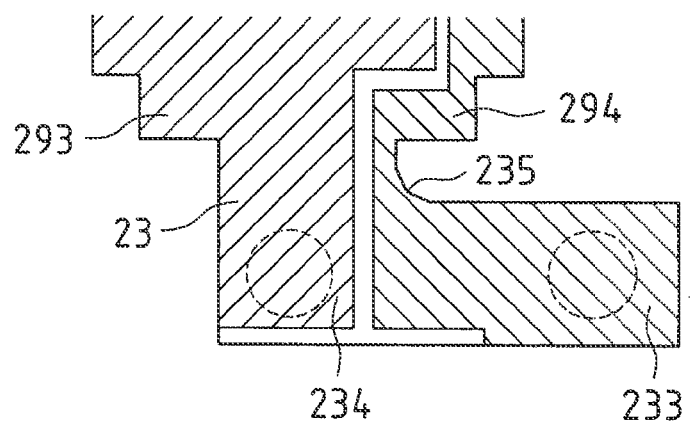
FIG. 18 is an enlarged schematic plan view of a bonding portion of a crystal resonator plate according to another embodiment of the present invention.

Also, the bonding portion 23 of the present embodiment is made up of a short-side portion 231 protruding perpendicularly to the second end face 252 of the base portion 25 as viewed from above and a long-side portion 232 that is connected to and bent with respect to the extremity of the short-side portion 231 at the right angle as viewed from above and extends in the width direction of the base portion 25, and a side face 235 of the inner corner of the corner portion 234 is formed to have the right angle, but the present invention is not limited thereto; the side face 235 of the inner corner of the corner portion 234 may be formed to have other configurations as shown in FIGS. 16 to 18.

In the embodiment described above, the extending direction of the long-side portion 232, which is the protruding direction of the bonding portion 23, is the −X axis direction. Accordingly, an inclined face formed when shaping the crystal resonator plate 2 by wet etching may be used as the side face 235 of the inner corner of the corner portion 234 shown in FIGS. 16 to 18, or part of the side face 235.

In addition, in this case, the strength of the corner portion 234 can be increased, as a result of which it is possible to suppress variations and shifts of the frequency.

A drop test was performed by using a crystal resonator 1 configured as shown in FIG. 17 described above and a crystal resonator 1 mounted on an external substrate (not shown). Specifically, two drop tests were performed: a single crystal resonator drop test in which each of twenty crystal resonators 1 was dropped freely; and a mounted crystal resonator drop test in which a crystal resonator 1 mounted on an external substrate was dropped with each face (six faces) of the external substrate aiming vertically downward from a height of 150 cm and a height of 180 cm (dropped six times in total relative to one height, which constituted one cycle). The results are shown in Table 1.

TABLE 1

| Single crystal resonator drop test: dropped freely | | | | | | | | | |
|---|---|---|---|---|---|---|---|---|---|
| Before test | 75 cm 3 times | 75 cm 5 times | 75 cm 10 times | 100 cm 3 times | 100 cm 5 times | 100 cm 10 times | 150 cm 3 times | 150 cm 5 times | 150 cm 10 times |
| 20 | 20 | 20 | 20 | 20 | 20 | 20 | 20 | 20 | 20 |
| | 1st | 2nd | 3rd | 4th | 5th | 10th | 15th | 20th | 30th | 50th |
| Mounted crystal resonator drop test: dropped with six faces aiming downward from 150 cm | | | | | | | | | |
| 20 | 20 | 20 | 20 | 20 | 20 | 20 | 20 | | |
| Mounted crystal resonator drop test: dropped with six faces aiming downward from 180 cm | | | | | | | | | |
| 20 | 20 | 20 | 20 | 20 | 20 | 20 | 20 | 20 | 20 |

The side face 235 of the inner corner of the corner portion 234 shown in FIG. 16 is formed into a curved face (rounded face). In this case, because the side face 235 of the inner corner of the corner portion 234 is formed into a curved face, with the side face 235 of the inner corner, the occurrence of cracks originating from the corner portion 234 can be suppressed, as a result of which it is possible to prevent short-circuiting of the lead electrode 294. In addition, in this case, the strength of the corner portion 234 can be increased, as a result of which it is possible to suppress variations and shifts of the frequency.

The side face 235 of the inner corner of the corner portion 234 shown in FIG. 17 is formed into a chamfered, polygonally bent face. In this case, because the side face 235 of the inner corner of the corner portion 234 is formed into a chamfered, polygonally bent face, with the side face 235 of the inner corner, the occurrence of cracks originating from the corner portion 234 can be suppressed, as a result of which it is possible to prevent short-circuiting of the lead electrode 294.

For comparison with the drop test results of the present embodiment, a single crystal resonator drop test using a crystal resonator in which a side face of an inner corner of a corner portion was formed at a right angle and a mounted crystal resonator drop test using such a crystal resonator mounted on an external substrate were performed. Specifically, in the single crystal resonator drop test, sixteen of such crystal resonators were respectively dropped freely, and in the mounted crystal resonator drop test, one of such a crystal resonator mounted on an external substrate was dropped with six faces of the external substrate aiming downward from a height of 150 cm, which constituted one cycle. The results are shown in Table 2. The crystal resonator plate of the comparative example is different from the crystal resonator plate of FIG. 17 in terms of the side face of the inner corner, and other configurations are the same.

TABLE 2

| Single crystal resonator drop test: dropped freely | | | | | | | | | |
|---|---|---|---|---|---|---|---|---|---|
| Before test | 75 cm 3 times | 75 cm 5 times | 75 cm 10 times | 100 cm 3 times | 100 cm 5 times | 100 cm 10 times | 150 cm 3 times | 150 cm 5 times | 150 cm 10 times |
| 16 | 16 | 15 | 15 | 15 | 15 | 14 | 14 | 14 | 14 |
| Mounted crystal resonator drop test: dropped with six faces aiming downward from 150 cm | | | | | | | | | |
| 1st | 2nd | 3rd | 4th | 5th | 10th | 15th | 20th | | |
| 14 | 14 | 14 | 14 | 14 | 13 | 13 | 13 | Three were broken | |

It can be seen from the results of the drop tests shown in Tables 1 and 2 that no breakage was observed (see Table 1) in the crystal resonator 1 shown in FIG. 17 and the crystal resonator 1 in FIG. 17 mounted on an external substrate, indicating that they have impact resistance, whereas in the crystal resonator of the comparative example and the crystal resonator of the comparative example mounted on an external substrate, two were broken in the single crystal resonator drop test and one was broken in the mounted crystal resonator drop test using the crystal resonator mounted on the external substrate (see Table 2). In other words, three were broken in total in the comparative example.

Next, the side face 235 of the inner corner of the corner portion 234 shown in FIG. 18 is formed into a polygonally bent face. In this case, because the side face 235 of the inner corner of the corner portion 234 is formed into a polygonally bent face, with the side face 235 of the inner corner, the occurrence of cracks originating from the corner portion 234 can be suppressed, as a result of which it is possible to prevent short-circuiting of the lead electrode 294. In addition, in this case, the strength of the corner portion 234 can be increased, as a result of which it is possible to suppress variations and shifts of the frequency.

Figure 19:
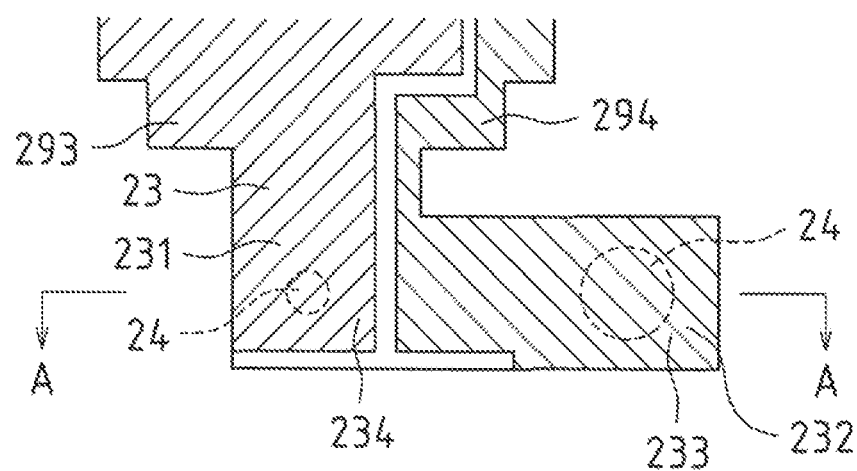
FIG. 19 is an enlarged schematic plan view of a bonding portion of a crystal resonator plate according to another embodiment of the present invention.
Figure 20:
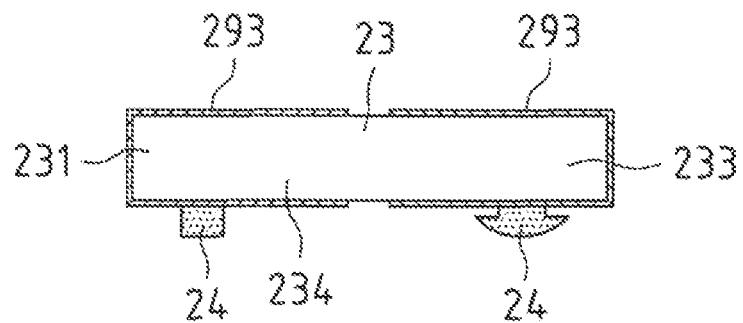
FIG. 20 is a cross-sectional view taken along the line A-A shown in FIG. 19.

Also, in the example described above, as shown in FIGS. 1 to 3, the two plated bumps 24 formed in the bond region of the bonding portion 23 have the same shape, but the present invention is not limited thereto; as shown in FIGS. 19 and 20, for example, a plated bump 24 formed in the bond region of the short-side portion 231 serving as a base end portion of the bonding portion 23 may be smaller than a plated bump 24 formed in the bond region of the long-side portion 232 serving as a distal end portion of the bonding portion 23.

In another embodiment shown in FIGS. 19 and 20, the plated bump 24 formed in the bond region of the short-side portion 231 serving as a base end portion of the bonding portion 23 is formed into a columnar shape with a small diameter, and the plated bump 24 formed in the bond region of the long-side portion 232 serving as a distal end portion of the bonding portion 23 is formed into a shape in which the top surface is spherical and the base has a columnar shape with a large diameter.

According to the embodiment shown in FIGS. 19 and 20, it is possible to reduce the transmission of vibrations from the first leg portion 21 and the second leg portion 22 serving as vibrating portions in the bond region of the short-side portion 231 serving as a base end portion of the bonding portion 23, which is closer to the first leg portion 21 and the second leg portion 22 serving as vibrating portions, while increasing the bonding strength of the crystal resonator plate 2 to the outside in the bond region of the long-side portion 232 serving as a distal end portion of the bonding portion 23, which is far from the first leg portion 21 and the second leg portion 22 serving as vibrating portions. As a result, it is possible to increase the bonding strength of the crystal resonator plate 2 to the outside while suppressing the influence of vibrations from the first leg portion 21 and the second leg portion 22 serving as vibrating portions.

Figure 21:
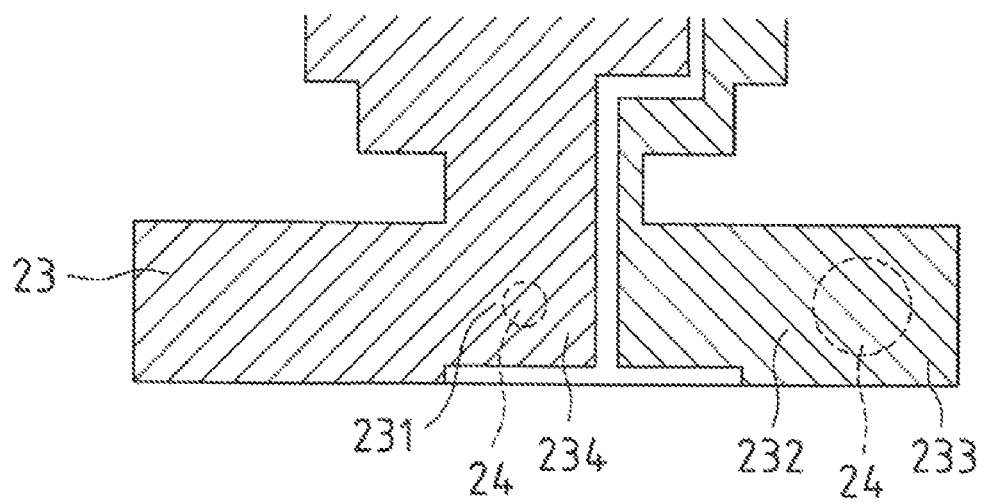
FIG. 21 is an enlarged schematic plan view of a bonding portion of a crystal resonator plate according to another embodiment of the present invention.
Figure 22:
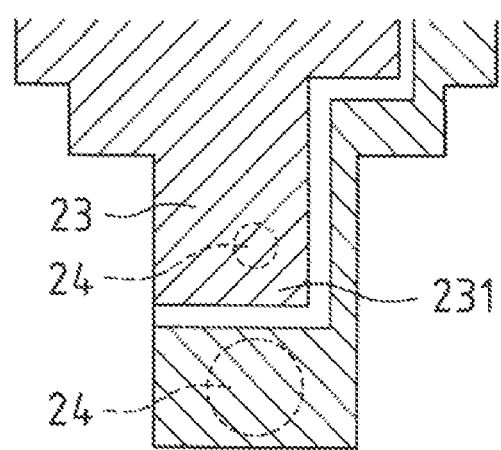
FIG. 22 is an enlarged schematic plan view of a bonding portion of a crystal resonator plate according to another embodiment of the present invention.

The plated bumps 24 shown in FIGS. 19 and 20 are applicable to all of the embodiments described above. For example, when the plated bumps 24 are applied to the crystal resonator plate 2 shown in FIG. 9, a configuration as shown in FIG. 21 is obtained. When the plated bumps 24 are applied to the crystal resonator plate 2 shown in FIG. 15, a configuration as shown in FIG. 22 is obtained.

Figure 23:
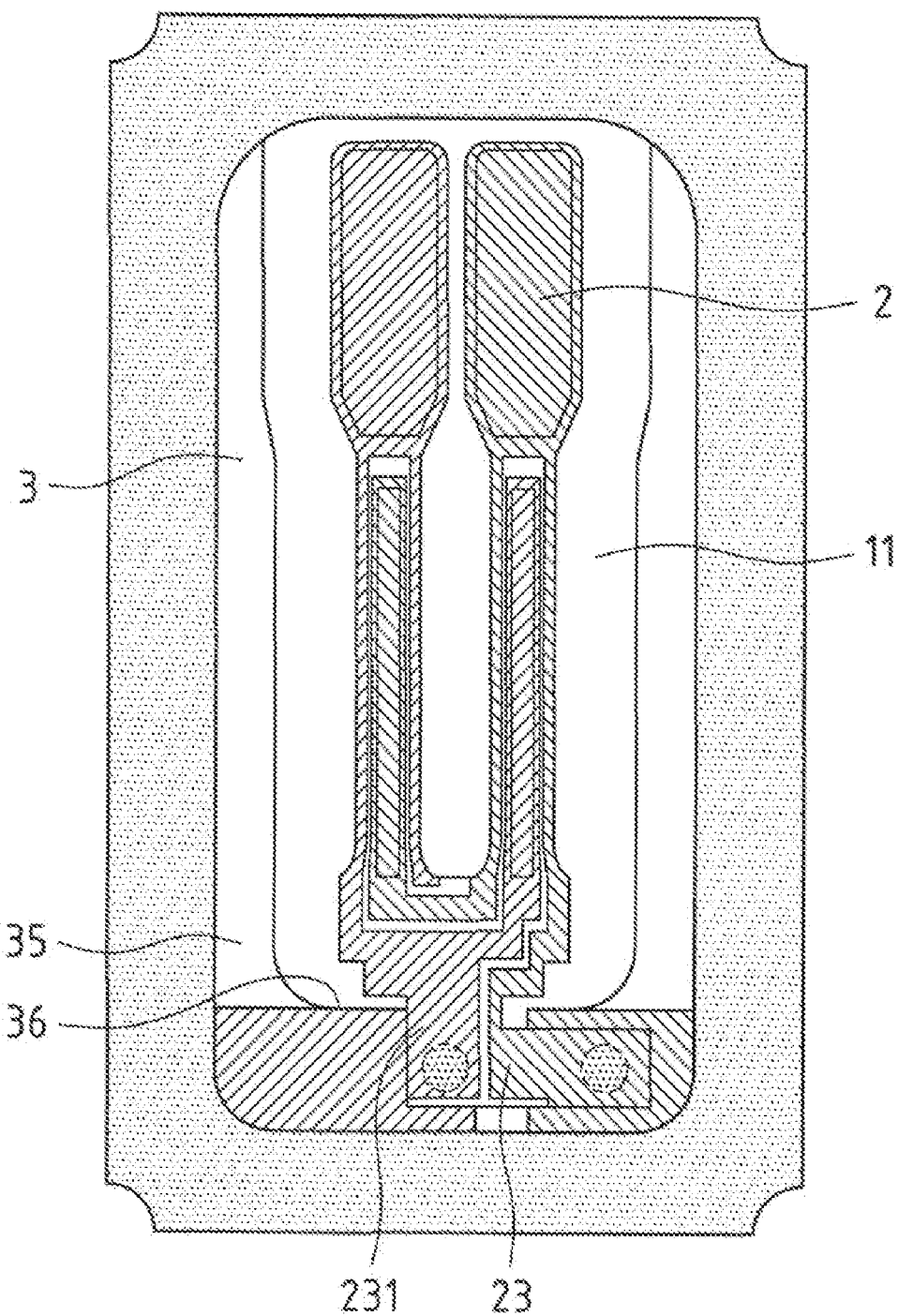
FIG. 23 is a schematic plan view showing the inside of a crystal resonator according to another embodiment of the present invention.

Also, in the above embodiments, the base 3 shown in FIG. 1 is used, but the configuration of the base 3 is not limited thereto; it is also possible to use a base configured as shown in FIG. 23.

A base 3 shown in FIG. 23 is different from the base 3 shown in FIG. 1 in terms of the shape of the step 35, and other configurations are the same. Specifically, in the base 3 shown in FIG. 23, the step 35 is formed to include one end portion in the longitudinal direction and the ends parallel to the longitudinal direction of the inner space 11. In addition, the length of the step 35 formed in one end portion in the longitudinal direction of the inner space 11 is made less than that of the base 3 shown in FIG. 1. Accordingly, when a crystal resonator plate 2 is mounted onto the base 3, as shown in FIG. 23, an edge 36 of the step 35 and the short-side portion 231 serving as a base end portion of the bonding portion 23 overlap as viewed from above.

In this case, because the edge 36 of the step 35 and the short-side portion 231 serving as a base end portion of the bonding portion 23 overlap as viewed from above, even if an external force (e.g., an external force applied to the crystal resonator 1 by the crystal resonator 1 being dropped) is applied to the crystal resonator 1, it is possible to suppress the crystal resonator plate 2 (in particular, the first leg portion 21, the second leg portion 22 and the base portion 25) from coming into contact with the edge 36 of the step 35 of the base 3. Accordingly, even if external forces are applied to the crystal resonator plate 2, it is possible to suppress variations and shifts of the frequency and improve the durability such as impact resistance.

Figure 24:
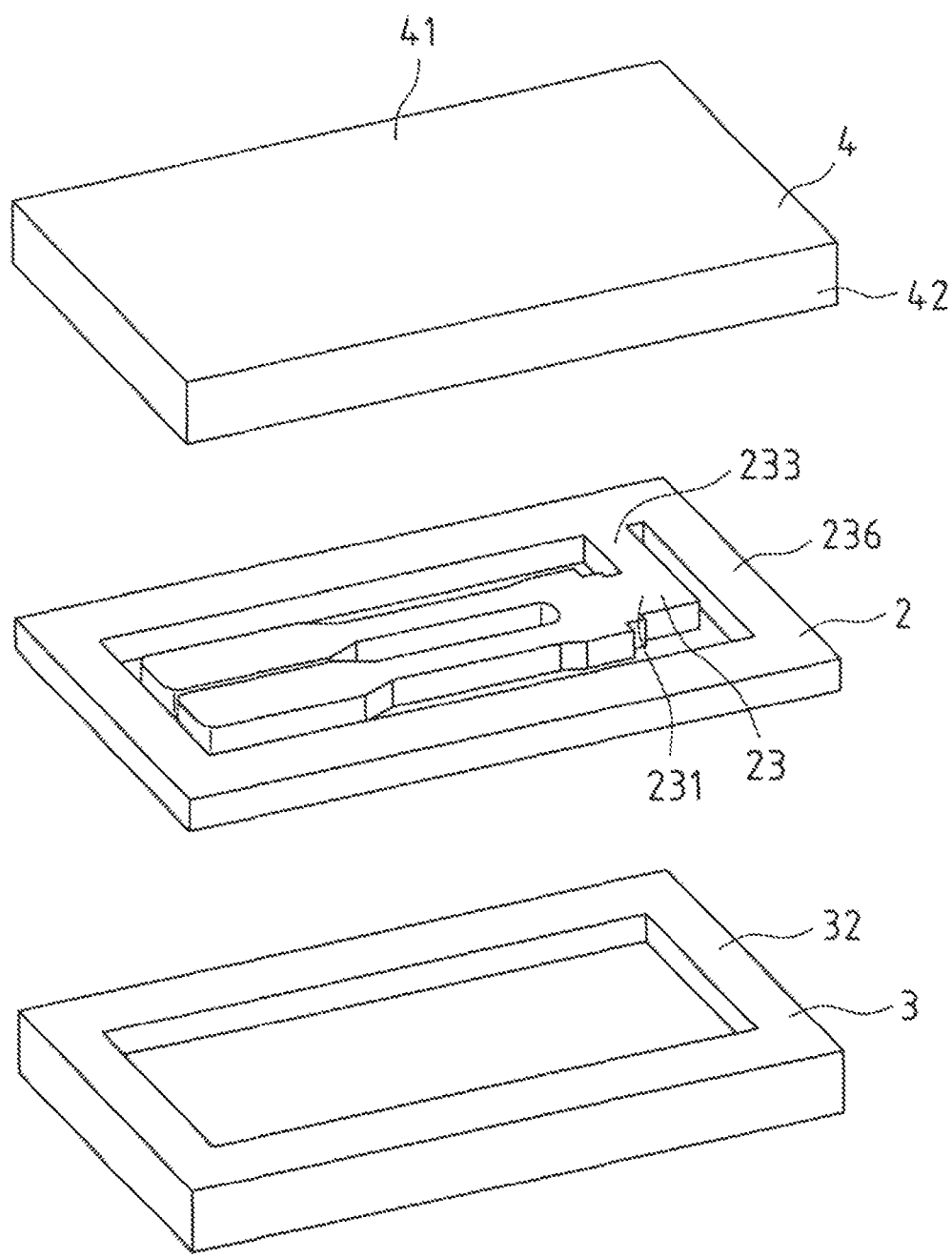
FIG. 24 is a schematic exploded perspective view of a crystal resonator according to another embodiment of the present invention.
Figure 25:
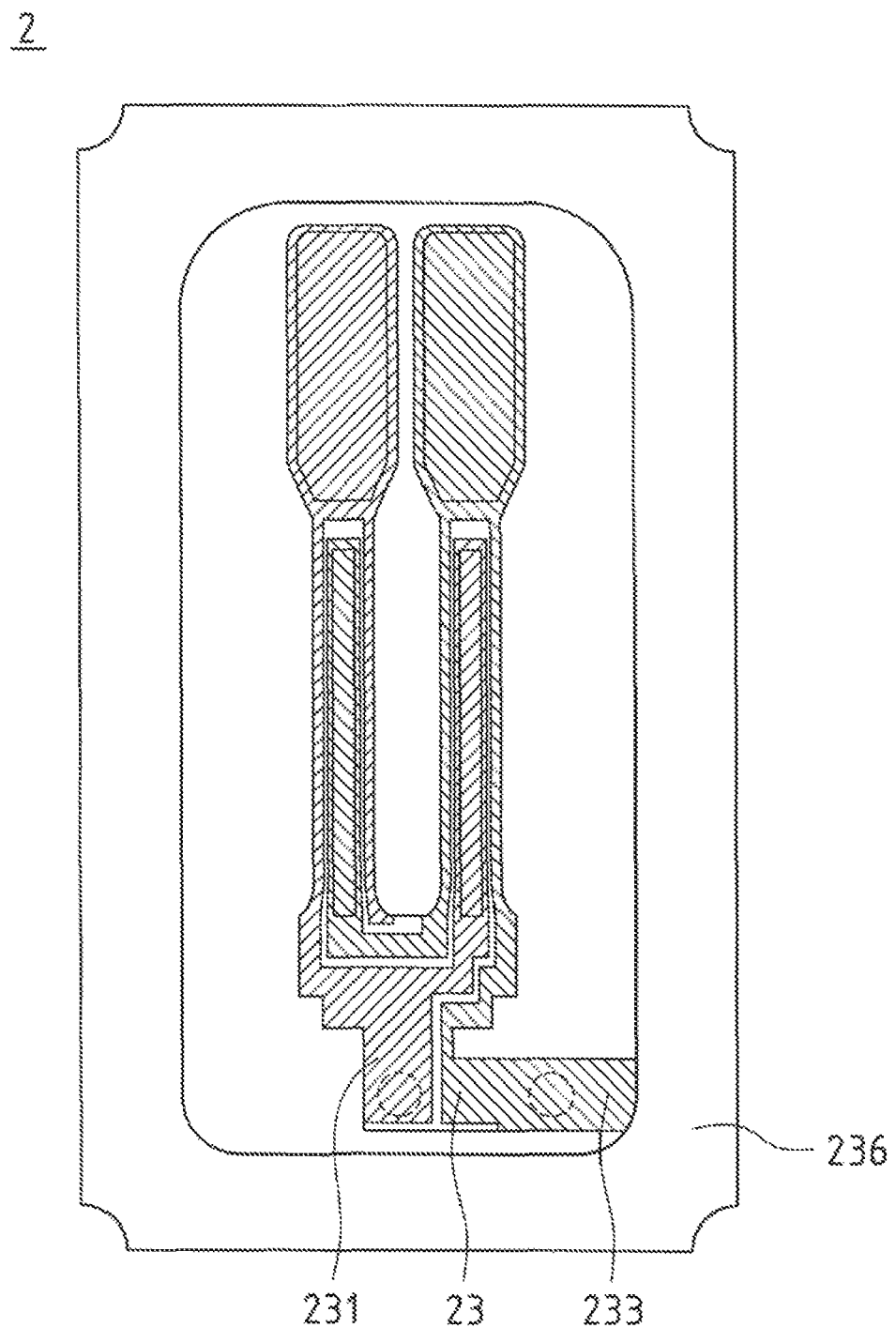
FIG. 25 is a schematic plan view of the crystal resonator plate shown in FIG. 24.

In the embodiment described above, the main body casing of the crystal resonator 1 is made up of a base 3 and a lid, and the crystal resonator plate 2 is hermetically sealed by the base 3 and the lid, but the crystal resonator plate is not limited thereto; the crystal resonator plate 2 may be part of the main body casing of the crystal resonator 1. Specifically, a configuration in which the crystal resonator plate 2 is part of the main body casing is shown in FIGS. 24 and 25. The crystal resonator 1 shown in FIGS. 24 and 25 is different in terms of the configuration of the lid and the configuration of the crystal resonator plate 2, and other configurations are the same. Accordingly, only differences of the crystal resonator 1 shown in FIGS. 24 and 25 from the crystal resonator 1 shown in FIG. 1 will be described. It should be noted that the operational effects and modifications according to the same configuration will be the same as those of the above-described embodiment.

A lid 4 is formed as a box-like body made up of a top portion 41 and a wall portion 42 that extends downward from the top portion 41 as shown in FIG. 24. The wall portion 42 is shaped along the periphery of the top portion 41 as viewed from above in FIG. 24. The lid 4 is made by placing a rectangular parallelepiped made of a ceramic material on a ceramic material plate having a rectangular shape as viewed from above and fusing them into a single unit with a cavity by firing, and is turned over for use. In the embodiment of FIG. 24, a ceramic material is used for the lid 4, but the present invention is not limited thereto; it is also possible to use glass, quartz, a metal material or the like.

In the crystal resonator plate 2, a frame body 236 that is disposed on the dike portion 32 of the base 3 when mounted onto the base 3 is formed, and the frame body 236 is connected to the distal end portion 233 of the bonding portion 23 to form a single unit.

In the crystal resonator 1 shown in FIGS. 24 and 25, the crystal resonator plate 2 is placed on the base 3 and then the lid 4 is placed thereon with the frame body 236 interposed between the base 3 and the lid 4.

In the crystal resonator 1 shown in FIGS. 24 and 25, the crystal resonator plate 2 is electromechanically bonded to the base 3 in the bonding portion 23, as in the crystal resonator 1 of the above-described embodiment, but the present invention is not limited thereto; it is possible to, by using the frame body 236 as part of the bonding portion 23, electrically connect the crystal resonator plate 2 and the base 3 via the frame body 236 and bond the crystal resonator plate 2 to the base 3 in at least the short-side portion 231 of the bonding portion 23.

The present invention may be embodied in various other forms without departing from the gist or essential characteristics thereof. Therefore, the embodiment described above is to be considered in all respects as illustrative and not limiting. The scope of the invention is indicated by the appended claims rather than by the foregoing description, and all modifications or changes that come within the meaning and range of equivalency of the claims are intended to be embraced therein.

In addition, this application claims priority on Japanese Patent Application No. 2008-248218 filed in Japan on Sep. 26, 2008, the entire contents of which are incorporated herein by reference.

INDUSTRIAL APPLICABILITY

The present invention is applicable to a tuning-fork type piezoelectric resonator plate and a tuning-fork type piezoelectric resonator device, and is particularly suitable for a tuning-fork type crystal resonator.

The invention claimed is:

1. A tuning-fork type piezoelectric resonator plate comprising:
at least a plurality of leg portions serving as vibrating portions; a bonding portion bonded to the outside, and a base portion from which the leg portions and the bonding portion protrude,
wherein the plurality of leg portions protrude from a first end face of the base portion and are provided side-by-side on the first end face,
the bonding portion has a base end portion formed such that the based end portion protrudes from a second end face located opposite the first end face of the base portion at a position located opposite a center position of the plurality of leg portions in a width direction of the first end face of the base portion, and
at least the base end portion of the bonding portion is formed so as to have a width narrower than a width of the second end face of the base portion, and is used as a bond region that is bonded to the outside,
the base portion has a right-and-left symmetrical shape as viewed from above, and
a second end portion of the base portion is formed such that the base portion tapers from the first end face side to the second end face side.

2. The tuning-fork type piezoelectric resonator plate according to claim 1,
wherein a pair of driving electrodes are formed in the leg portions, and lead electrodes drawn out from the pair of driving electrodes are formed in the bonding portion and the base portion, respectively,
the lead electrode drawn out from one of the pair of driving electrodes is formed in the base end portion of the bonding portion, and the lead electrode drawn out from the other of the pair of driving electrodes is formed in a distal end portion of the bonding portion, and
the distal end portion of the bonding portion is used as a bond region bonded to the outside.

3. The tuning-fork type piezoelectric resonator plate according to claim 1,
wherein both primary surfaces of the base end portion of the bonding portion are used as bond regions bonded to the outside.

4. The tuning-fork type piezoelectric resonator plate according to claim 1,
wherein a plated bump is formed in the bond regions.

5. The tuning-fork type piezoelectric resonator plate according to claim 1,
wherein a groove is formed in a primary surface of at least one of the vibrating portions.

6. A tuning-fork type piezoelectric resonator device,
wherein the tuning-fork type piezoelectric resonator device includes the tuning-fork type piezoelectric resonator plate according to claim 1, a first sealing member on which the tuning-fork type piezoelectric resonator plate is mounted, and a second sealing member for hermetically sealing the tuning-fork type piezoelectric resonator plate mounted on the first sealing member within a main body casing.

7. The tuning-fork type piezoelectric resonator device according to claim 6,
wherein a step on which the tuning-fork type piezoelectric resonator plate is mounted is provided in the first sealing member, and
an edge of the step and the base end portion of the bonding portion overlap as viewed from above.

8. A tuning-fork type piezoelectric resonator plate comprising
at least a plurality of leg portions serving as vibrating portions; a bonding portion bonded to the outside, and a base portion from which the leg portions and the bonding portion protrude,
wherein the plurality of leg portions protrude from a first end face of the base portion and are provided side-by-side on the first end face,
the bonding porting has a base end portion formed such that the based end portion protrudes from a second end face located opposite the first end face of the base portion at a position located opposite a center position of the plurality of leg portions in a width direction of the first end face of the base portion,
at least the base end portion of the bonding portion is formed so as to have a width narrower than a width of the second end face of the base portion, and is used as a bond region that is bonded to the outside, and
the bonding portion is formed into an L shape, one side of which serves as the base end portion, as viewed from above.

9. The tuning-fork type piezoelectric resonator plate according to claim 8,
wherein the bond region of the bonding portion that is bonded to the outside is formed in a corner portion that is a bent part of the L-shaped bonding portion as viewed from above and in the distal end portion of the bonding portion.

10. The tuning-fork type piezoelectric resonator plate according to claim 9,
wherein a side face of an inner corner of the corner portion is formed into a curved face.

11. The tuning-fork type piezoelectric resonator plate according to claim 9,
wherein a side face of an inner corner of the corner portion is formed into a polygonally bent face.

12. A tuning-fork type piezoelectric resonator device,
wherein the tuning-fork type piezoelectric resonator device includes the tuning-fork type piezoelectric resonator plate according to claim 8, a first sealing member on which the tuning-fork type piezoelectric resonator plate is mounted, and a second sealing member for hermetically sealing the tuning-fork type piezoelectric resonator plate mounted on the first sealing member within a main body casing.

13. The tuning-fork type piezoelectric resonator device according to claim 12,
wherein a step on which the tuning-fork type piezoelectric resonator plate is mounted is provided in the first sealing member, and
an edge of the step and the base end portion of the bonding portion overlap as viewed from above.

14. A tuning-fork type piezoelectric resonator plate comprising
at least a plurality of leg portions serving as vibrating portions; a bonding portion bonded to the outside, and a base portion from which the leg portions and the bonding portion protrude,
wherein the plurality of leg portions protrude from a first end face of the base portion and are provided side-by-side on the first end face,
the bonding portion protrudes from a second end face located opposite the first end face of the base portion at a position located opposite a center position of the plurality of leg portions in a width direction of the first end face of the base portion,
at least a base end portion of the bonding portion is used as a bond region that is bonded to the outside,
a pair of driving electrodes are formed in the leg portions, and lead electrodes drawn out from the pair of driving electrodes are formed in the bonding portion and the base portion, respectively,
the lead electrode drawn out from one of the pair of driving electrodes is formed in the base end portion of the bonding portion, and the lead electrode drawn out from the other of the pair of driving electrodes is formed in a distal end portion of the bonding portion,
the base end portion and the distal end portion of the bonding portion are used as bond regions bonded to the outside,
a bump bonded to the outside is formed in each of the bond regions, and
the bump formed in the bond region of the base end portion of the bonding portion is smaller than the bump formed in the bond region of the distal end portion of the bonding portion.

15. A tuning-fork type piezoelectric resonator device,
wherein the tuning-fork type piezoelectric resonator device includes the tuning-fork type piezoelectric resonator plate according to claim 14, a first sealing member on which the tuning-fork type piezoelectric resonator plate is mounted, and a second sealing member for hermetically sealing the tuning-fork type piezoelectric resonator plate mounted on the first sealing member within a main body casing.

16. The tuning-fork type piezoelectric resonator device according to claim 15,
wherein a step on which the tuning—fork type piezoelectric resonator plate is mounted is provided in the first sealing member, and
an edge of the step and the base end portion of the bonding portion overlap as viewed from above.

* * * * *